US012615930B2

(12) United States Patent
Xiao et al.

(10) Patent No.: US 12,615,930 B2
(45) Date of Patent: Apr. 28, 2026

(54) DISPLAY SUBSTRATE AND DISPLAY DEVICE

(71) Applicants: CHENGDU BOE OPTOELECTRONICS TECHNOLOGY CO., LTD., Chengdu (CN); BOE TECHNOLOGY GROUP CO., LTD., Beijing (CN)

(72) Inventors: Bangqing Xiao, Beijing (CN); Meng Li, Beijing (CN); Kunyan Shi, Beijing (CN); Benlian Wang, Beijing (CN)

(73) Assignees: CHENGDU BOE OPTOELECTRONICS TECHNOLOGY CO., LTD., Chengdu (CN); BOE TECHNOLOGY GROUP CO., LTD., Beijing (CN)

( * ) Notice: Subject to any disclaimer, the term of this patent is extended or adjusted under 35 U.S.C. 154(b) by 631 days.

(21) Appl. No.: 18/007,475

(22) PCT Filed: Feb. 28, 2022

(86) PCT No.: PCT/CN2022/078401
§ 371 (c)(1),
(2) Date: Jan. 30, 2023

(87) PCT Pub. No.: WO2023/159598
PCT Pub. Date: Aug. 31, 2023

(65) Prior Publication Data
US 2024/0260341 A1     Aug. 1, 2024

(51) Int. Cl.
*H10K 59/131*     (2023.01)
*H10K 59/65*     (2023.01)

(52) U.S. Cl.
CPC .......... *H10K 59/131* (2023.02); *H10K 59/65* (2023.02)

(58) Field of Classification Search
CPC ............................ H10K 59/131; H10K 59/65
See application file for complete search history.

(56) References Cited

U.S. PATENT DOCUMENTS

2022/0069047 A1* 3/2022 Yang .................... H10K 59/131
2022/0352292 A1 11/2022 Yang et al.

FOREIGN PATENT DOCUMENTS

| CN | 111916486 A | 11/2020 |
| CN | 111969027 A | 11/2020 |
| CN | 112216733 A | 1/2021 |

(Continued)

OTHER PUBLICATIONS

International Search Report and Written Opinion dated Sep. 28, 2022, for corresponding PCT Application No. PCT/CN2022/078401.

*Primary Examiner* — Anne M Hines
(74) *Attorney, Agent, or Firm* — Kinney & Lange, P.A.

(57) ABSTRACT

A display substrate and a display device are provided. The display substrate includes: a plurality of first light emitting devices arranged in a plurality of columns in a first direction to form a plurality of pixel column groups, including a first pixel column group, a second pixel column group and a third pixel column group that are arranged from an edge to a center of a first display region. Connection wires for transmitting driving signals to the first light emitting devices in the first pixel column group are located in a same transparent conductive layer as connection wires for transmitting driving signals to the first light emitting devices in the third pixel column group.

19 Claims, 24 Drawing Sheets

(56) References Cited

FOREIGN PATENT DOCUMENTS

| | | | |
|---|---|---|---|
| CN | 112909051 | A | 6/2021 |
| CN | 113764460 | A | 12/2021 |
| CN | 113764501 | A | 12/2021 |

* cited by examiner

71

61    41

72

62    41

632/642

VH2

6    VH2

54

54

No transparent
conductive layer
and VH2

DISPLAY SUBSTRATE AND DISPLAY DEVICE

CROSS-REFERENCE TO RELATED APPLICATION(S)

This application is a Section 371 National Stage Application of International Application No. PCT/CN2022/078401 filed on Feb. 28, 2022, the whole disclosure of which is incorporated herein by reference in its entirety.

TECHNICAL FIELD

The present disclosure relates to a field of display technology, and in particular to a display substrate and a display device.

BACKGROUND

An organic light emitting diode (OLED) display device has characteristics of wide viewing angle, high contrast, fast response, wide color gamut, high screen-to-body ratio, self-illumination, light and thin, etc. Due to the above-mentioned characteristics, the OLED display device has gradually attracted an extensive attention and may be applied to mobile phones, displays, laptop computers, smart watches, digital cameras, instruments, flexible wearable devices and other devices with display functions. With users' increasing demand for a diversified use of the display device and an emergence of a design requirement for a high screen-to-body ratio of the display device, a solution of "under display camera" has emerged. In the solution of "under display camera", an imaging module such as a camera or the like may be embedded in a display region to reduce a size of a bezel region of a display device, so that a screen-to-body ratio may be increased.

The above information disclosed in this section is merely for the understanding of the background of the technical concept of the present disclosure. Therefore, the above information may contain information that does not constitute the related art.

SUMMARY

In an aspect, a display substrate is provided, including a first display region and a second display region at least partially surrounding the first display region, the display substrate includes: a base substrate; a plurality of first light emitting devices, the plurality of first light emitting devices are arranged in an array in a first direction and a second direction on the base substrate and are located in the first display region; a plurality of first pixel driving circuits, the plurality of first pixel driving circuits are arranged in an array in the first direction and the second direction on the base substrate and are located in the second display region, and at least a part of the first pixel driving circuits are configured to respectively drive the plurality of first light emitting devices to emit light; and a plurality of connection wires, at least one of the plurality of connection wires has one end electrically connected to at least one of the first light emitting devices and the other end electrically connected to at least one of the first pixel driving circuits, and the plurality of connection wires are configured to respectively transmit driving signals to the plurality of first light emitting devices, the plurality of first light emitting devices are arranged in a plurality of columns in the first direction to form a plurality of pixel column groups, the plurality of pixel column groups include a first pixel column group, a second pixel column group and a third pixel column group, and the first pixel column group, the second pixel column group and the third pixel column group are arranged from an edge of the first display region to a center of the first display region; and the connection wires for transmitting driving signals to the first light emitting devices in the first pixel column group are located in a same transparent conductive layer as the connection wires for transmitting driving signals to the first light emitting devices in the third pixel column group.

According to some exemplary embodiments, the plurality of first light emitting devices are arranged in 2n columns in the first direction, n is a positive integer, and a first column of first light emitting devices are located at an edge of the first display region on a side of the first display region close to the second display region; the plurality of connection wires include a first connection wire and a second connection wire; the first pixel column group includes the first light emitting devices located in a first column to an $n_1{}^{th}$ column, the second pixel column group includes the first light emitting devices in an $(n_1+1)^{th}$ column to an $n_2{}^{th}$ column, the first light emitting devices in the first column to the $n_1{}^{th}$ column are electrically connected to corresponding first pixel driving circuits through first connection wires, and the first light emitting devices in the $(n_1+1)^{th}$ column to the $n_2{}^{th}$ column are electrically connected to corresponding first pixel driving circuits through second connection wires, $1<n_1<n_2<n$, and both $n_1$ and $n_2$ are positive integers; and the first connection wires are located in a first transparent conductive layer, and the second connection wires are located in a second transparent conductive layer.

According to some exemplary embodiments, the first connection wire and the second connection wire both extend through the first display region and the second display region in the first direction.

According to some exemplary embodiments, the plurality of first light emitting devices are arranged in 2m rows in the second direction, m is a positive integer, and a first row of first light emitting devices are located at an edge of the first display region on a side of the first display region close to the second display region; the plurality of connection wires further include a third connection wire; the third pixel column group includes the first light emitting devices located in an $(n_2+1)^{th}$ column to an $n^{th}$ column and in an $(m_1+1)^{th}$ row to an $m^{th}$ row, and the first light emitting devices located in the $(n_2+1)^{th}$ column to the $n^{th}$ column and in the $(m_1+1)^{th}$ row to the $m^{th}$ row are electrically connected to corresponding first pixel driving circuits through third connection wires, $1<m_1<m$, and $m_1$ is a positive integer; and the third connection wire includes a first part, a second part and a third part, the first part of the third connection wire extends in the first direction and is completely located in the first display region, the second part of the third connection wire extends in the second direction and extends from the first display region to the second display region, and the third part of the third connection wire extends in the second display region in the first direction.

According to some exemplary embodiments, the third part of the third connection wire is spaced from the first connection wire in the second direction, and an extension line of the third part of the third connection wire in the first direction does not pass through the first display region.

According to some exemplary embodiments, the third connection wire further includes a fourth part and a fifth part, the fourth part of the third connection wire extends in the second direction, the fifth part of the third connection wire extends in the first direction, and the fourth part and the fifth part of the third connection wire are both located in the second display region.

According to some exemplary embodiments, the plurality of connection wires further include a fourth connection wire; the first light emitting devices located in the $(n_2+1)^{th}$ column to the $n^{th}$ column and in a $(m_2+1)^{th}$ row to a $m_1^{th}$ row are electrically connected to corresponding first pixel driving circuits through fourth connection wires, $13m_2<m_1-1$, and $m_2$ is a positive integer; and a part of the fourth connection wire is located in the first transparent conductive layer, and the other part of the fourth connection wire is located in the second transparent conductive layer.

According to some exemplary embodiments, the fourth connection wire includes a first part, a second part, a third part, a fourth part and a fifth part, the first part of the fourth connection wire extends in the first direction and is completely located in the first display region, the second part of the fourth connection wire extends in the second direction and extends from the first display region to the second display region, the third part of the fourth connection wire extends in the first direction, the fourth part of the fourth connection wire extends in the second direction, the fifth part of the fourth connection wire extends in the first direction, and the third part, the fourth part and the fifth part of the fourth connection wire are all located in the second display region.

According to some exemplary embodiments, the first part, the second part, the third part and the fourth part of the fourth connection wire are all located in the first transparent conductive layer, and the fifth part of the fourth connection wire is located in the second transparent conductive layer.

According to some exemplary embodiments, the plurality of connection wires further include a fifth connection wire; the first light emitting devices in the $(n_2+1)^{th}$ column to the $n^{th}$ column and in the first row to a $m_2^{th}$ row are electrically connected to the first pixel driving circuits through fifth connection wires; and a part of the fifth connection wire is located in the first transparent conductive layer, and the other part of the fifth connection wire is located in the second transparent conductive layer.

According to some exemplary embodiments, the fifth connection wire includes a first part, a second part, a third part, a fourth part and a fifth part, the first part of the fifth connection wire extends in the first direction and is completely located in the first display region, the second part of the fifth connection wire extends in the second direction and extends from the first display region to the second display region, the third part of the fifth connection wire extends in the first direction, the fourth part of the fifth connection wire extends in the second direction, the fifth part of the fifth connection wire extends in the first direction, and the third part, the fourth part and the fifth part of the fifth connection wire are all located in the second display region.

According to some exemplary embodiments, the first part, the second part, the third part and the fourth part of the fifth connection wire are all located in the first transparent conductive layer, and the fifth part of the fifth connection wire is located in the second transparent conductive layer.

According to some exemplary embodiments, for a plurality of fifth connection wires for providing driving signals to the first light emitting devices located in the $(n_2+1)^{th}$ column to the $n^{th}$ column and in the first row to the $m_2^{th}$ row, first parts and second parts of a part of the fifth connection wires are located in the first transparent conductive layer, and first parts and second parts of the other part of the fifth connection wires are located in the second transparent conductive layer.

According to some exemplary embodiments, for the plurality of fifth connection wires for providing driving signals to the first light emitting devices located in the $(n_2+1)^{th}$ column to the $n^{th}$ column and in the first row to the $m_2^{th}$ row, third parts and fourth parts of all the fifth connection wires are located in the first transparent conductive layer, and fifth parts of all the fifth connection wires are located in the second transparent conductive layer.

According to some exemplary embodiments, an orthographic projection of the first connection wire on the base substrate at least partially overlaps with an orthographic projection of the second connection wire on the base substrate.

According to some exemplary embodiments, at least one of the first connection wire and the second connection wire has an arched part.

According to some exemplary embodiments, the second display region includes a first display sub-region and a second display sub-region, and the first display sub-region and the second display sub-region are located on opposite sides of the first display region in the first direction; and a plurality of first light emitting devices in the first column to an $n^{th}$ column are electrically connected to the first pixel driving circuits located in the first display sub-region through a part of the plurality of connection wires, and a plurality of first light emitting devices in an $(n+1)^{th}$ column to the $2n^{th}$ column are electrically connected to the first pixel driving circuits located in the second display sub-region through the other part of the plurality of connection wires.

According to some exemplary embodiments, the plurality of first pixel driving circuits in the first display sub-region are arranged in k columns in the first direction, and a first column of first pixel driving circuits are located at an edge of the first display sub-region on a side of the first display sub-region close to the first display region, and k is a positive integer greater than or equal to n; and at least a part column of the first column of first pixel driving circuits to a kth column of first pixel driving circuits are electrically connected to the first column of first light emitting devices to the $n^{th}$ column of first light emitting devices through the connection wires.

According to some exemplary embodiments, the display substrate further includes a plurality of second pixel driving circuits and a plurality of dummy circuits, and the plurality of second pixel driving circuits and the plurality of dummy circuits are all located in the second display region; and two columns of the second pixel driving circuits and/or dummy circuits are arranged between at least two adjacent columns of the first pixel driving circuits.

According to some exemplary embodiments, the plurality of connection wires are respectively electrically connected to the plurality of first pixel driving circuits through a second connection via hole; and an orthographic projection of the second connection via hole on the base substrate is spaced from an orthographic projection of the dummy circuit on the base substrate.

According to some exemplary embodiments, an orthographic projection of the connection wires for providing driving signals to the plurality of first light emitting devices located in the first column to the $n^{th}$ column and in the first row to the $m^{th}$ row on the base substrate is axisymmetric with an orthographic projection of the connection wires for providing driving signals to the plurality of first light emitting devices located in the $(n+1)^{th}$ column to the $2n^{th}$ column and in the first row to the m$^{th}$ row on the base substrate, with respect to a first symmetry axis extending in the second direction; and/or an orthographic projection of the connection wires for providing driving signals to the plurality of first light emitting devices located in the first column to the n$^{th}$ column and in the first row to the m$^{th}$ row on the base substrate is axisymmetric with an orthographic projection of the connection wires for providing driving signals to the plurality of first light emitting devices located in the first column to the n$^{th}$ column and in the (m+1)$^{th}$ row to the 2m$^{th}$ row on the base substrate with respect to a second symmetry axis extending in the first direction.

According to some exemplary embodiments, the first transparent conductive layer and the second transparent conductive layer respectively include transparent conductive materials.

In another aspect, a display device is provided, including the display substrate described above.

According to some exemplary embodiments, the display device further includes a sensor, the display substrate has a first side for display and a second side opposite to the first side, and the first display region allows a light from the first side to at least partially transmit to the second side, and the sensor is arranged on the second side of the display substrate, and the sensor is configured to receive the light from the first side.

According to some exemplary embodiments, an orthographic projection of the sensor on the display substrate at least partially overlaps with the first display region.

BRIEF DESCRIPTION OF THE DRAWINGS

By describing the exemplary embodiments of the present disclosure in detail with reference to the accompanying drawings, features and advantages of the present disclosure will become more apparent.

DETAILED DESCRIPTION OF EMBODIMENTS

Figures 1, 2:
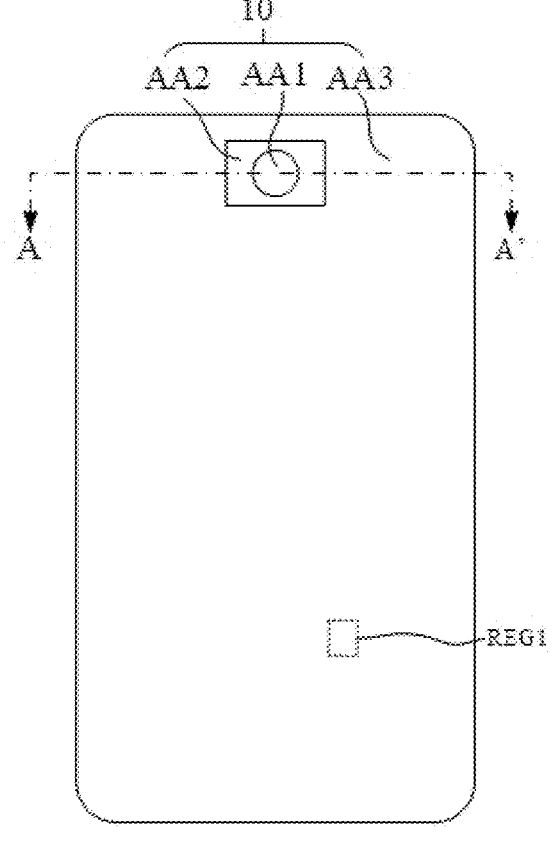
FIG. 1 is a schematic plan view of a display device according to some exemplary embodiments of the present disclosure, in which a planar structure of a display substrate included in the display device is schematically shown.
FIG. 2 is a schematic cross-sectional view of the display device according to some exemplary embodiments of the present disclosure taken along line AA' in FIG. 1.

In order to make objectives, technical solutions and advantages of the present disclosure clearer, the technical solution of the embodiments of the present disclosure will be clearly and completely described below with reference to the accompanying drawings. Obviously, the described embodiments are merely some embodiments of the present disclosure, rather than all embodiments. Based on the described embodiments of the present disclosure, all additional embodiments obtained by those ordinary skilled in the art without carrying out inventive effort fall within the scope of protection of the present disclosure.

It should be noted that in the accompanying drawings, for clarity and/or description purposes, a size and a relative size of an element may be enlarged. Accordingly, the size and the relative size of each element are not required to be limited to those shown in the drawings. In the specification and the accompanying drawings, the same or similar reference numerals indicate the same or similar components.

When an element is described as being "on", "connected to" or "coupled to" another element, the element may be directly on the another element, directly connected to the another element, or directly coupled to the another element, or an intermediate element may be provided. However, when an element is described as being "directly on", "directly connected to" or "directly coupled to" another element, no intermediate element is provided. Other terms and/or expressions used to describe a relationship between elements, such as "between" and "directly between", "adjacent" and "directly adjacent", "on" and "directly on", and so on, should be interpreted in a similar manner. In addition, a term "connection" may refer to a physical connection, an electrical connection, a communication connection, and/or a fluid connection. In addition, X-axis, Y-axis and Z-axis are not limited to three axes of a rectangular coordinate system, and may be interpreted in a broader meaning. For example, the X-axis, the Y-axis and the Z-axis may be perpendicular to each other, or may represent different directions that are not perpendicular to each other. As used herein, a term "and/or" includes any and all combinations of one or more of the listed related items.

It should be noted that although terms "first", "second", and so on may be used herein to describe various components, members, elements, regions, layers and/or parts, these components, members, elements, regions, layers and/or parts should not be limited by these terms. Rather, these terms are used to distinguish one component, member, element, region, layer and/or part from another. Thus, for example, a first component, a first member, a first element, a first region, a first layer and/or a first part discussed below may be referred to as a second component, a second member, a second element, a second region, a second layer and/or a second part without departing from teachings of the present disclosure.

For ease of description, spatial relationship terms, such as "upper", "lower", "left", "right" and so on may be used here to describe a relationship between one element or feature and another element or feature as shown in the drawings. It should be understood that the spatial relationship terms are intended to cover other different orientations of a device in use or operation in addition to orientations described in the drawings. For example, if the device in the drawing is turned upside down, an element or feature described as "below" or "under" another element or feature will be oriented as "above" or "on" the another element or feature.

Herein, an expression "pixel unit" may refer to a combination of a plurality of sub-pixels, for example, a combination of a plurality of sub-pixels for displaying a pixel point, and a plurality of "pixel units" are repeatedly arranged in an array on a base substrate. For example, a pixel unit may include two, three, four or more sub-pixels. In addition, herein, for ease of description, the pixel unit located in a first display region is referred to as a first pixel unit, the pixel unit located in a second display region is referred to as a second pixel unit, and the pixel unit located in a third display region is referred to as a third pixel unit.

Herein, an expression "pixel density" refers to a number of pixel units or sub-pixels per unit area. Similarly, an expression "distribution density" refers to a number of components (such as pixel units, sub-pixels, light emitting devices, etc.) arranged in an array per unit area.

The embodiments of the present disclosure provide a display substrate, including a first display region and a second display region at least partially surrounding the first display region. The display substrate includes: a base substrate; a plurality of first light emitting devices arranged in an array in a first direction and a second direction on the base substrate and located in the first display region; a plurality of first pixel driving circuits arranged in an array in the first direction and the second direction on the base substrate and located in the second display region, and at least partial first pixel driving circuits are used to respectively drive the plurality of first light emitting devices to emit light; and a plurality of connection wires, at least one of the plurality of connection wires has one end electrically connected to at least one of the first light emitting devices and the other end electrically connected to at least one of the first pixel driving circuits. The plurality of connection wires are used to respectively transmit driving signals to the plurality of first light emitting devices. The plurality of first light emitting devices are arranged in a plurality of columns in the first direction to form a plurality of pixel column groups. The plurality of pixel column groups include a first pixel column group, a second pixel column group and a third pixel column group. The first pixel column group, the second pixel column group and the third pixel column group are arranged from an edge of the first display region to a center of the first display region. The connection wire for transmitting a driving signal to the first light emitting device in the first pixel column group is located in a same transparent conductive layer as the connection wire for transmitting a driving signal to the first light emitting device in the third pixel column group. In the embodiments of the present disclosure, the plurality of connection wires may be arranged in at most two transparent conductive layers, so that a number of masks may be reduced, and a production cost may be reduced.

FIG. 1 is a schematic plan view of a display device according to some exemplary embodiments of the present disclosure, in which a planar structure of a display substrate included in the display device is schematically shown. FIG. 2 is a schematic cross-sectional view of the display device according to some exemplary embodiments of the present disclosure taken along line AA' in FIG. 1.

As shown in FIG. 1, the display device according to the embodiments of the present disclosure includes a display substrate 10. The display substrate 10 includes a display region that may include a first display region AA1, a second display region AA2 and a third display region AA3. For example, the first display region AA1, the second display region AA2 and the third display region AA2 do not overlap with each other. For example, the third display region AA3 at least partially surrounds (for example, completely surrounds) the second display region AA2, and the second display region AA2 at least partially surrounds (for example, completely surrounds) the first display region AA1.

For a display substrate having an under display sensor (for example, an image sensor), in order to increase a light transmittance of a display region of the display substrate corresponding to the under display sensor, a distribution density per unit area (e.g., PPI) of light emitting devices in the display region corresponding to the under display sensor may be less than that of light emitting devices in other display regions of the display substrate.

As shown in FIG. 2, the display substrate 10 may include a base substrate 1. A sensor 2001 may be provided on a rear surface (shown as a lower side in FIG. 2, which may be, for example, a side opposite to a light exit direction during display) of the base substrate 1 in the first display region AA1, and the first display region AA1 may meet an imaging requirement of the sensor 2001 for light transmittance.

For example, a light transmittance of the first display region AA1 is greater than a light transmittance of the second display region AA2. The sensor 2001 may be, for example, an image sensor or an infrared sensor or the like. The sensor 2001 is configured to receive light rays from a display side of the display substrate 10 (an upper side in FIG. 2, which may be, for example, the light exit direction during display, or a direction of human eyes during display), so that image capturing, distance sensing, light intensity sensing and other operations may be performed. For example, these light rays penetrate the first display region AA1 and then irradiate onto the sensor so as to be sensed by the sensor.

It should be noted that in the illustrated exemplary embodiment, the third display region AA3 completely surrounds the second display region AA2, and the second display region AA2 completely surrounds the first display region AA1. However, the embodiments of the present disclosure are not limited to this. For example, in other embodiments, the second display region AA2 may be located at an upper edge of the display substrate. For example, three sides of the second display region AA2 are surrounded by the third display region AA3, and an upper side of the second display region AA2 is aligned with the upper edge of the display substrate. For another example, the second display region AA2 may be located at the upper edge of the display substrate and arranged along an entire width of the display substrate.

For example, the first display region AA1 may have a shape of a circle or an ellipse, and the second display region AA2 and the third display region AA3 may have a shape of a circle, an ellipse or a rectangle. However, the embodiments of the present disclosure are not limited to this. For another example, the first display region AA1, the second display region AA2 and the third display region AA3 may all have a shape of a rectangle, a rounded rectangle or another suitable shape.

In the display substrate shown in FIG. 1 to FIG. 2, an OLED display technology may be used. Due to wide viewing angle, high contrast, fast response, low power consumption, foldability, flexibility and other advantages, an OLED display substrate is more and more widely used in display products. With a development and an in-depth application of the OLED display technology, a demand for a display screen having a high screen-to-body ratio becomes stronger. In the display substrate shown in FIG. 1 to FIG. 2, a solution of under display camera is adopted. In this way, a notch region may be eliminated, opening in the display screen may be avoided, and the screen-to-body ratio may be increased, so that a good visual experience may be achieved.

In addition, the display substrate may further include a driving circuit layer, a light emitting device layer and an encapsulation layer that are arranged on the base substrate 1. For example, a driving circuit layer 2002, a light emitting device layer 2003 and an encapsulation layer 2004 are schematically shown in FIG. 2. The driving circuit layer 2002 includes a driving circuit structure, and the light emitting device layer 2003 includes a light emitting device such as an OLED. The driving circuit structure controls light emitting devices of each sub-pixel to emit light so as to achieve a display function. The driving circuit structure may include a thin film transistor, a storage capacitor and various signal lines. The various signal lines may include a gate line, a data line, an ELVDD power line, an ELVSS power line, and so on, so as to provide various signals such as a control signal, a data signal and a power supply voltage to the pixel driving circuit in each sub-pixel.

Figure 3:
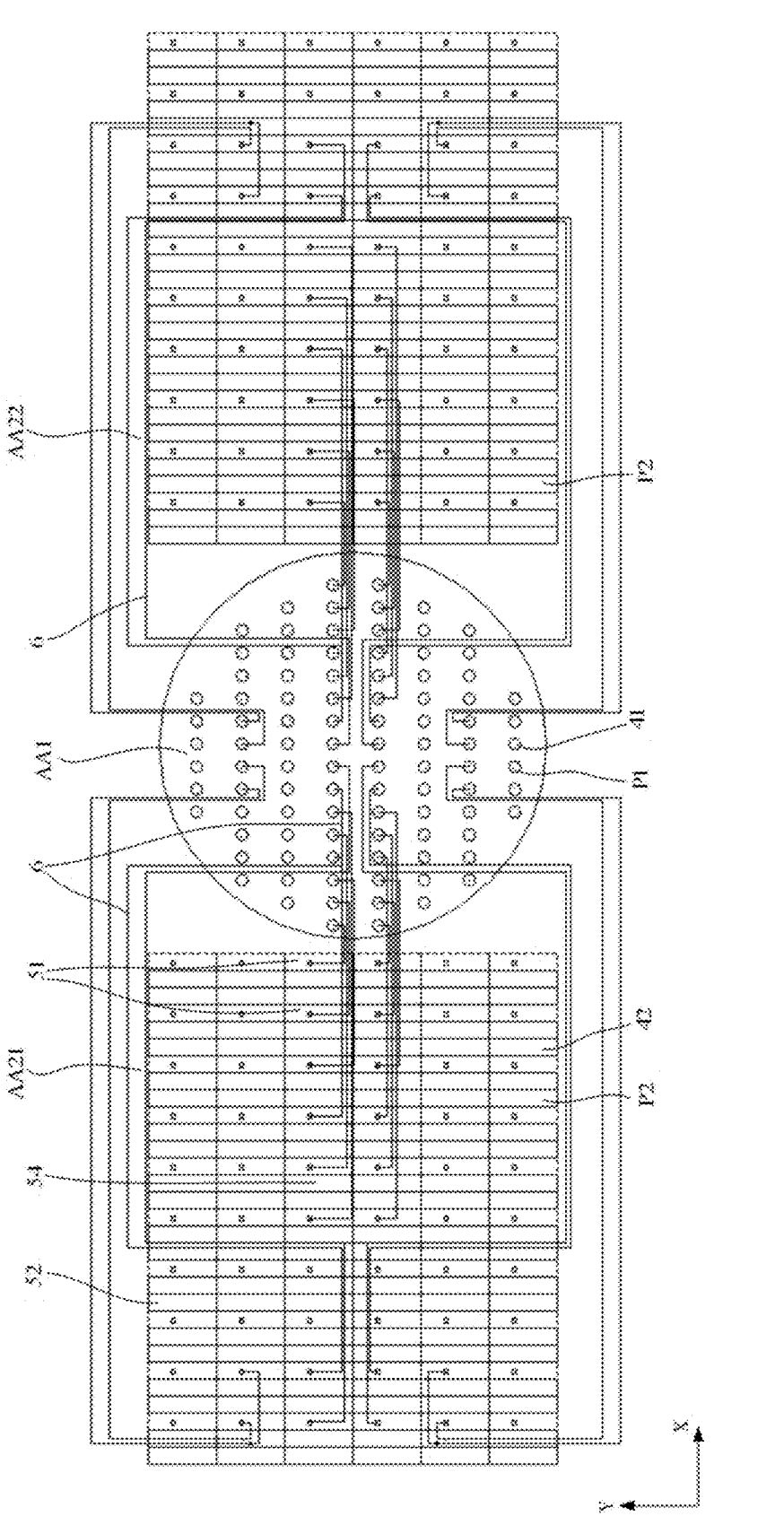
FIG. 3 is a schematic partial diagram of a first display region and a second display region of the display substrate shown in FIG. 1.
Figure 4A:
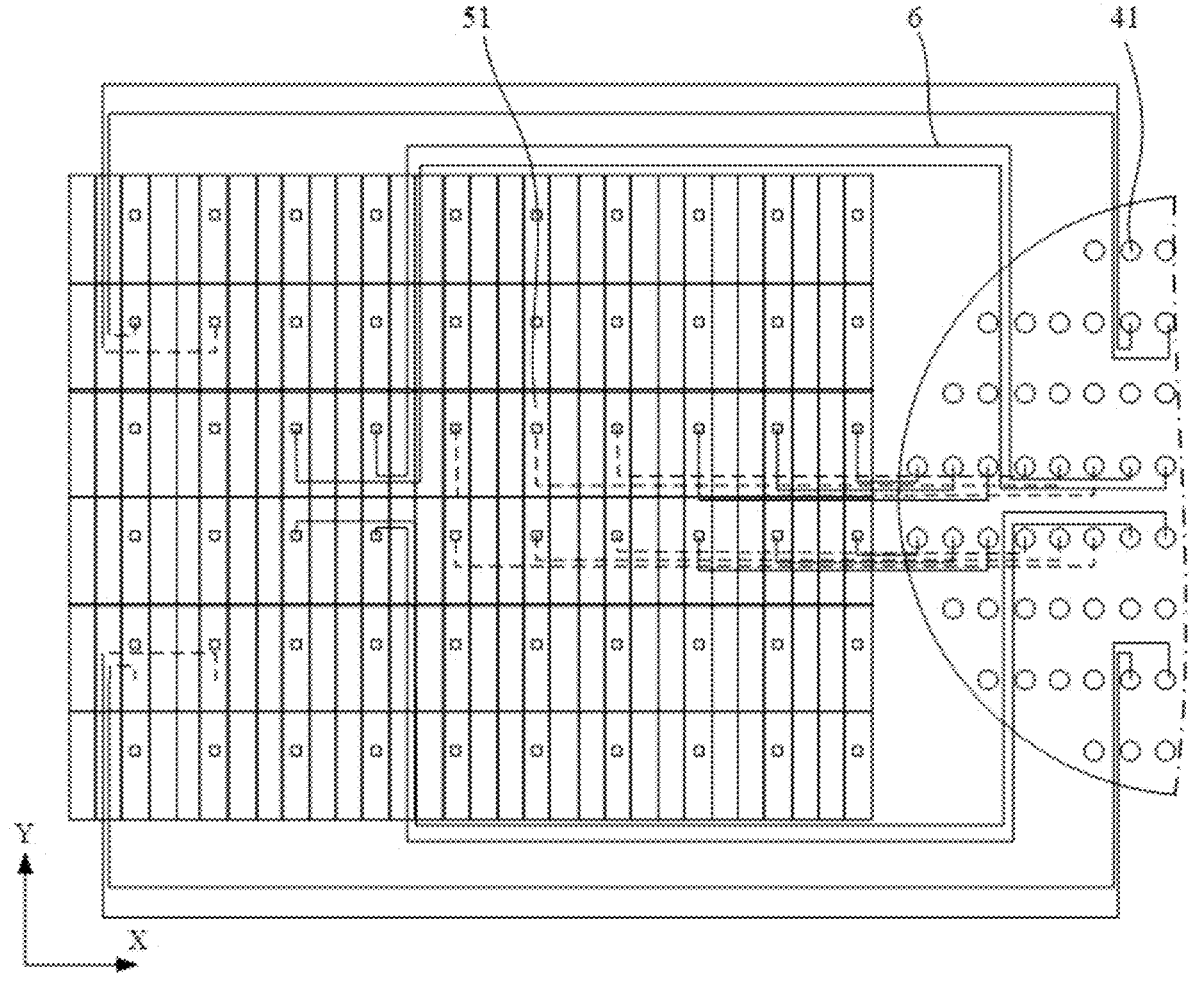
FIG. 4A is a partial enlarged view of a left half in FIG. 3.
Figure 4B:
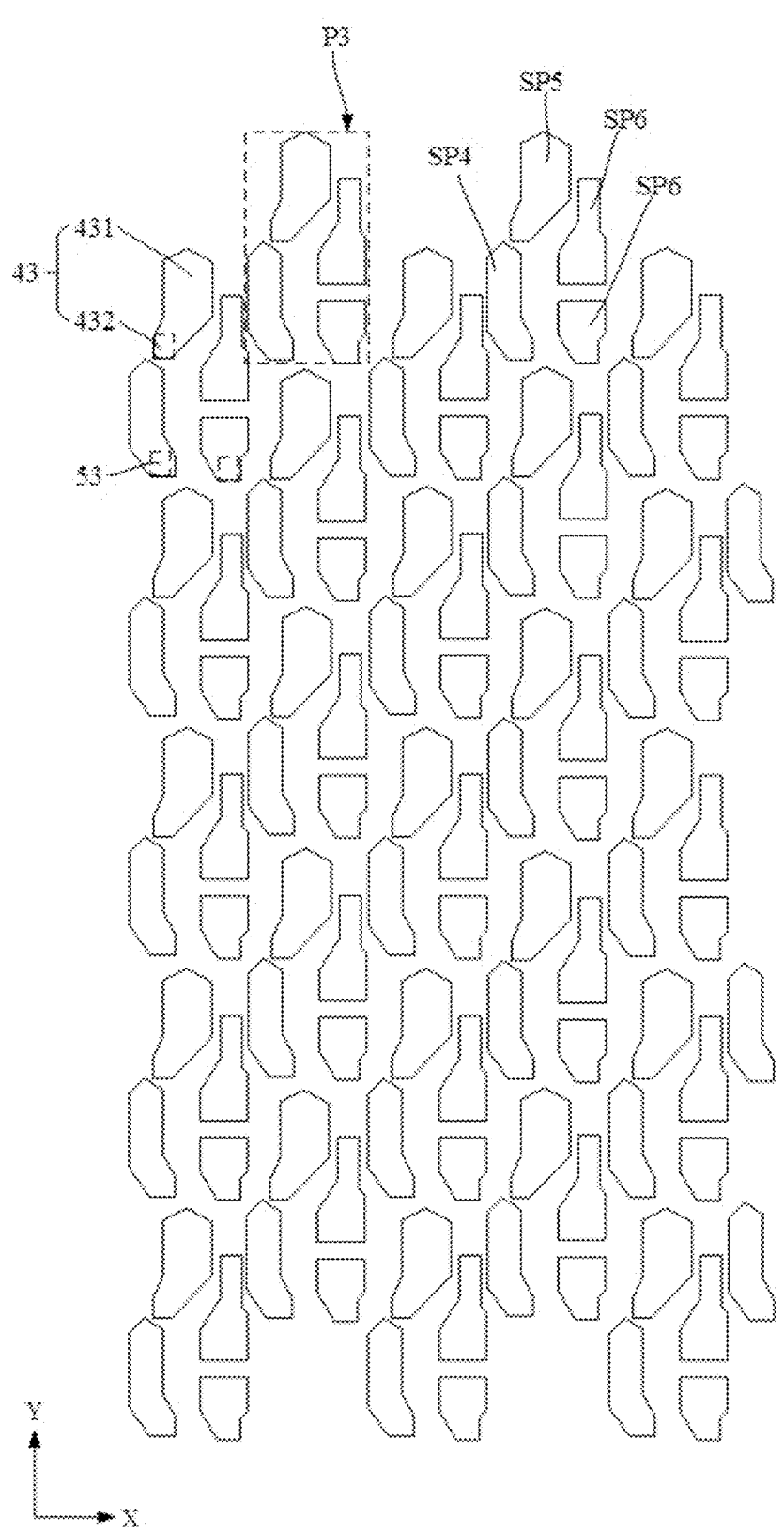
FIG. 4B is a partial enlarged view of a partial region REG1 in FIG. 1.

FIG. 3 is a schematic partial diagram of the first display region and the second display region of the display substrate shown in FIG. 1. FIG. 4A is a partial enlarged view of a left half in FIG. 3. FIG. 4B is a partial enlarged view of a partial region REG1 in FIG. 1.

Referring to FIG. 1 to FIG. 4B, the display substrate 10 may include a plurality of first pixel units P1 located in the first display region AA1, a plurality of second pixel units P2 located in the second display region AA2 and a plurality of third pixel units P3 located in the third display region AA3. As shown in FIG. 3 to FIG. 4B, the plurality of first pixel units P1, the plurality of second pixel units P2 and the plurality of third pixel units P3 are respectively arranged in an array on the base substrate 1 of the display substrate 10. For example, the plurality of first pixel units P1 are arranged in an array in a first direction (X direction shown in the drawings) and a second direction (Y direction shown in the drawings) in the first display region AA1. The plurality of second pixel units P2 are arranged in an array in the first direction (the X direction shown in the drawings) and the second direction (the Y direction shown in the drawings) in the second display region AA2. The plurality of third pixel units P3 are arranged in an array in the first direction (the X direction shown in the drawings) and the second direction (the Y direction shown in the drawings) in the third display region AA3.

Each of the plurality of first pixel units P1 includes a first light emitting device 41. Each of the plurality of second pixel units P2 includes a second light emitting device 42. Each of the plurality of third pixel units P3 includes a third light emitting device 43.

In the embodiments of the present disclosure, in order to reduce an occlusion of an optical signal incident to the first display region AA1 and transmitted toward the sensor 2001 by an element in the first display region AA1, a distribution density of the plurality of first pixel units P1 in the first display region AA1 is less than a distribution density of the plurality of second pixel units P2 in the second display region AA2, and the distribution density of the plurality of first pixel units P1 in the first display region AA1 is also less than the distribution density of the plurality of third pixel units P3 in the third display region AA3. That is, a distribution density of the plurality of first light emitting devices in the first display region AA1 is less than a distribution density of the plurality of second light emitting devices in the second display region AA2, and the distribution density of the plurality of first light emitting devices in the first display region AA1 is also less than the distribution density of the plurality of third light emitting devices in the third display region AA3.

In the embodiments of the present disclosure, each pixel unit P1, P2, P3 may include a plurality of sub-pixels. In some embodiments, the first pixel unit P1 may further include a plurality of sub-pixels, such as a red sub-pixel, a green sub-pixel and a blue sub-pixel. Similarly, the second pixel unit P2 may further include a plurality of sub-pixels, such as a red sub-pixel, a green sub-pixel and a blue sub-pixel. The third pixel unit P3 may further include a plurality of sub-pixels, such as a red sub-pixel, a green sub-pixel and a blue sub-pixel.

It should be noted that red, green and blue are illustrated by way of example in describing the embodiments of the present disclosure. However, the embodiments of the present disclosure are not limited to this. That is, each pixel unit may include sub-pixels having at least two different colors, such as a first color, a second color and a third color, and the first color, the second color and the third color are different colors.

As shown in FIG. 3 and FIG. 4A, the first pixel unit P1 may include a plurality of first light emitting devices 41 located in the first display region AA1. It should be noted that, for the sake of clarity, an anode structure of the first light emitting device 41 is used in relevant drawings to schematically show the first light emitting device 41.

A plurality of first pixel driving circuits 51 are located in the second display region AA2. For example, at least part of the plurality of first pixel driving circuits 51 are configured to respectively drive the plurality of first light emitting devices 41. For example, a rectangular box shown in FIG. 3 and FIG. 4A represents a first pixel driving unit, and each first pixel driving unit may include a first number of pixel driving circuits 51. For example, a ratio of the number of first pixel driving units in the second display region AA2 to a number of first light emitting devices 41 is 2:1. It should be noted that THE embodiments of the present disclosure are not limited to this, and the ratio may be set to other values, such as 3:1, 4:1, and so on. Accordingly, the pixel driving circuit of only one first pixel driving unit in every three first pixel driving units is used to drive the first light emitting device 41. Thus, the pixel driving circuit included in the first pixel driving unit used to drive the first light emitting device 41 is referred to as the first pixel driving circuit 51, and the pixel driving circuit included in the first pixel driving unit not used to drive the first light emitting device 41 is referred to as a dummy circuit 54. For example, the first pixel driving circuit 51 and the dummy circuit 54 may have substantially the same circuit structure. For example, the first number of first pixel driving circuits 51 included in each first pixel driving unit used to drive the first light emitting devices 41 are configured to respectively drive the first number of first light emitting devices 41 of a corresponding first pixel unit P1 in the plurality of first pixel units P1. For example, as shown in FIG. 3 and FIG. 4A, a plurality of first light emitting devices 41 are arranged in an array, and a plurality of first pixel driving circuits 51 are arranged in an array.

For example, as shown in FIG. 3 and FIG. 4A, each of the plurality of second pixel units P2 includes a second light emitting device 42 and a second pixel driving circuit 52 for driving the second light emitting device 42. The second light emitting device 42 and the second pixel driving circuit 52 are both located in the second display region AA2. An orthographic projection of the second light emitting device 42 on the base substrate 1 at least partially overlaps with an orthographic projection of the second pixel driving circuit 52 for driving the second light emitting device 42 on the base substrate 1.

For example, as shown in FIG. 4B, each of the plurality of third pixel units P3 includes a third light emitting device 43 and a third pixel driving circuit 53 for driving the third light emitting device 43. The third light emitting device 43 and the third pixel driving circuit 53 are both located in the third display region AA3. An orthographic projection of the third light emitting device 43 on the base substrate 1 at least partially overlaps with an orthographic projection of the third pixel driving circuit 53 for driving the third light emitting device 43 on the base substrate 1.

For example, in some exemplary embodiments of the present disclosure, a first pixel unit P1 includes at least one (e.g., one) sub-pixel having a first color, at least one (e.g., one) sub-pixel having a second color, and at least one (e.g., two) sub-pixel having a third color. A second pixel unit P2 includes at least one (e.g., one) sub-pixel having the first color, at least one (e.g., one) sub-pixel having the second color, and at least one (e.g., two) sub-pixel having the third color. A third pixel unit P3 includes at least one (e.g., one) sub-pixel having the first color, at least one (e.g., one) sub-pixel having the second color, and at least one (e.g., two) sub-pixel having the third color. For example, as shown in FIG. 4B, the sub-pixel having the first color, the sub-pixel having the second color and the sub-pixel having the third color are respectively represented by reference numerals SP4, SP5 and SP6. For example, the first color may be red, the second color may be blue, and the third color may be green. A sub-pixel may include a light emitting device and a pixel driving circuit for driving the light emitting device to emit light. The light emitting device may include a first electrode, a second electrode, and a luminescent material layer located therein. The pixel driving circuit may include a transistor, a capacitor, and other elements. The pixel driving circuit may receive a signal from a signal line provided on the display substrate, generate a current for driving the light emitting device, and drive the light emitting device to emit light through a connection with one of the first electrode and the second electrode. For example, the pixel driving circuit is arranged on the base substrate, and the light emitting device is located on a side of the pixel driving circuit away from the base substrate. In some embodiments, the display substrate further includes a pixel definition layer located on a side of the first electrode away from the pixel driving circuit. The pixel definition layer includes a plurality of openings, each sub-pixel corresponds to at least one (e.g., one) opening of the pixel definition layer, and an actual light emitting region or display region of the sub-pixel is substantially equivalent to the opening of the pixel definition layer corresponding to the sub-pixel. In some embodiments, the opening of the pixel definition layer corresponding to the sub-pixel or the actual light emitting region of the sub-pixel has an area less than an area of the first electrode, and a projection of the opening of the pixel definition layer corresponding to the sub-pixel or the actual light emitting region of the sub-pixel on the base substrate completely falls within a projection of the first electrode on the base substrate. For ease of illustration, only approximate positions and shapes of first electrodes (for example, anode structures) of the sub-pixels are shown in FIG. 4B to represent a distribution of each sub-pixel.

For example, in some embodiments of the present disclosure, an arrangement of sub-pixels in each pixel unit may refer to a conventional pixel arrangement, such as GGRB, RGBG, RGB, etc., which is not limited in the embodiments of the present disclosure.

As shown in FIG. 4B, each sub-pixel in the third display region AA3 may include the third light emitting device 43. For example, the third light emitting device 43 may include an anode structure, a luminescent material layer and a cathode structure that are stacked. It should be noted that, for the sake of clarity, the anode structure of the third light emitting device 43 is used in relevant drawings to schematically show the third light emitting device 43, so as to schematically show the sub-pixel located in the third display region AA3. For example, in the third display region AA3, the anode structure of the third light emitting device 43 includes an anode body 431 and an anode connection part 432. An orthographic projection of the anode body 431 on the base substrate 1 may have a regular shape, such as a hexagon. The third display region AA3 is further provided with a pixel driving circuit for driving the third light emitting device 43, and the anode connection part 432 is electrically connected to the pixel driving circuit of the third light emitting device 43.

For example, in the embodiment of FIG. 4B, in the third display region AA3, each of an orthographic projection of the anode body 431 of the sub-pixel SP4 on the base substrate 1 and an orthographic projection of the anode body 431 of the sub-pixel SP5 on the base substrate 1 may have a regular shape of a hexagon (for example, a rounded hexagon), and an orthographic projection of the anode body 431 of the sub-pixel SP6 on the base substrate 1 may have a regular shape of a pentagon (for example, a rounded pentagon). It should be noted that the shape of the orthographic projection of the anode body 431 on the base substrate 1 is not limited to the above-mentioned shapes. Any suitable shape, such as an octagon, a rectangle, a rounded rectangle, and so on, may be selected.

As shown in FIG. 3 and FIG. 4A, each sub-pixel in the first display region AA1 may include the first light emitting device 41. For example, the first light emitting device 41 may include an anode structure, a luminescent material layer and a cathode structure that are stacked. For example, the first display region AA1 includes a plurality of first light emitting devices 41 arranged in an array, and the first light emitting devices 41 are configured to emit light. No pixel driving circuit is provided in the first display region AA1, and the pixel driving circuit for driving the first light emitting device 41 is arranged in the second display region AA2, so that a metal coverage area of the first display region AA1 is reduced and the light transmittance of the first display region AA1 is increased. In this way, the light transmittance of the first display region AA1 may be greater than the light transmittance of the second display region AA2 and the light transmittance of the third display region AA3.

For example, in the embodiment shown in FIG. 3 and FIG. 4A, in the first display region AA1, an orthographic projection of the anode structure of each sub-pixel on the base substrate 1 may be substantially circular or elliptical. In this way, a light emitting area of the light emitting device of each sub-pixel in the first display region AA1 is increased, so that a service life of the light emitting device of each sub-pixel in the first display region AA1 is prolonged.

It should be understood that the anode structure of the first light emitting device 41 may include an anode body and an anode connection part. An orthographic projection of the anode body on the base substrate 1 may be substantially circular or elliptical. The anode connection part of the first light emitting device 41 may be electrically connected to a first end (to be described below) of a connection wire 6, so that the first light emitting device 41 is electrically connected to its pixel driving circuit.

As shown in FIG. 3 and FIG. 4A, a plurality of first light emitting devices 41 are located in the first display region AA1, and a plurality of first pixel driving circuits 51 are located in the second display region AA2. Each first pixel driving circuit 51 is electrically connected to at least one first light emitting device 41, and is used to provide a driving signal to the at least one first light emitting device 41 electrically connected thereto. The driving signal is used to drive the at least one first light emitting device 41 to emit light.

In the embodiments of the present disclosure, the display substrate 10 further includes a plurality of connection wires 6. At least one of the plurality of connection wires 6 has one end electrically connected to at least one first light emitting device 41, and the other end electrically connected to at least one first pixel driving circuit 51. In other words, one end of at least one of the plurality of connection wires 6 is located in the first display region AA1, and the other end is located in the second display region AA2, that is, at least one of the plurality of connection wires 6 extends from the first display region AA1 to the second display region AA2. In this way, the first light emitting device 41 located in the first display region AA1 may be electrically connected to the first pixel driving circuit 51 located in the second display region AA2. The plurality of connection wires 6 are used to respectively provide driving signals to the plurality of first light emitting devices 41.

In the embodiments of the present disclosure, by providing, in the second display region AA2, the plurality of first pixel driving circuits 51 configured to respectively drive the plurality of first light emitting devices 41, and overlapping the sensor 2001 with the first display region AA1 in a normal direction of a display surface of the display substrate, the occlusion of the optical signal incident to the first display region AA1 and transmitted toward the sensor 2001 by the element in the first display region AA1 may be reduced, so that a signal-to-noise ratio of an image output by the sensor 2001 may be improved. For example, the first display region AA1 may be referred to as a high light-transmission region of a low resolution region of the display substrate 10.

For example, the sensor 2001 may be an image sensor and may be used to capture an image of an external environment that a light capturing surface of the sensor 2001 faces. For example, the sensor may be a CMOS image sensor or a CCD image sensor. The sensor 2001 may also be an infrared sensor, a distance sensor, or the like. For example, when the display device is a mobile terminal such as a mobile phone or a laptop computer, the sensor 2001 may be used to implement a camera of the mobile terminal such as the mobile phone or the laptop computer, and may further include an optical device such as a lens, a reflector or an optical waveguide as required to modulate an optical path. For example, the sensor 2001 may include photosensitive pixels arranged in an array. For example, each photosensitive pixel may include a photosensitive detector (e.g., a photodiode, a phototransistor) and a switch transistor (e.g., a switch transistor). For example, the photodiode may convert an optical signal irradiated thereon into an electrical signal, and the switch transistor may be electrically connected to the photodiode to control whether the photodiode is in a state of capturing the optical signal and control a time of capturing the optical signal.

In some examples, in the first display region AA1, only the anode of the first light emitting device 41 is opaque, that is, the connection wire 6 for driving the first light emitting device 41 is provided as a transparent wire. In this case, not only a transmissivity of the first display region AA1 may be further improved, but also a diffraction caused by each element in the first display region AA1 may be reduced.

Figure 5A:
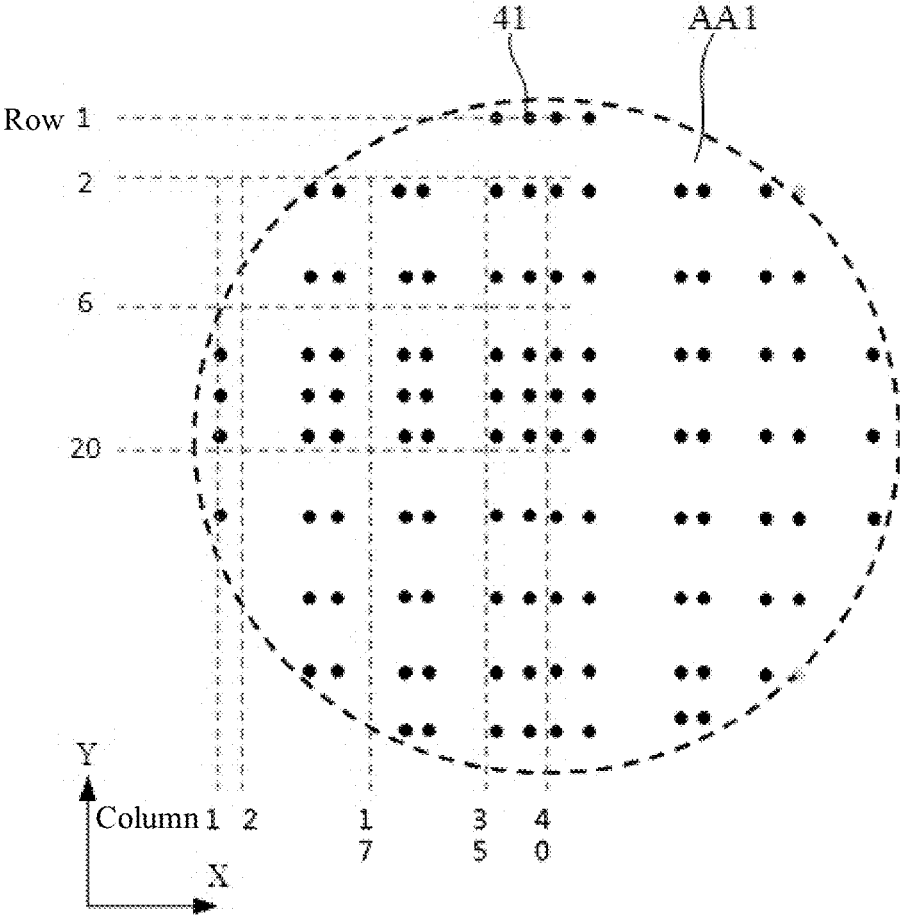
FIG. 5A is a schematic diagram of a first display region of a display substrate according to some exemplary embodiments of the present disclosure.
Figure 5B:
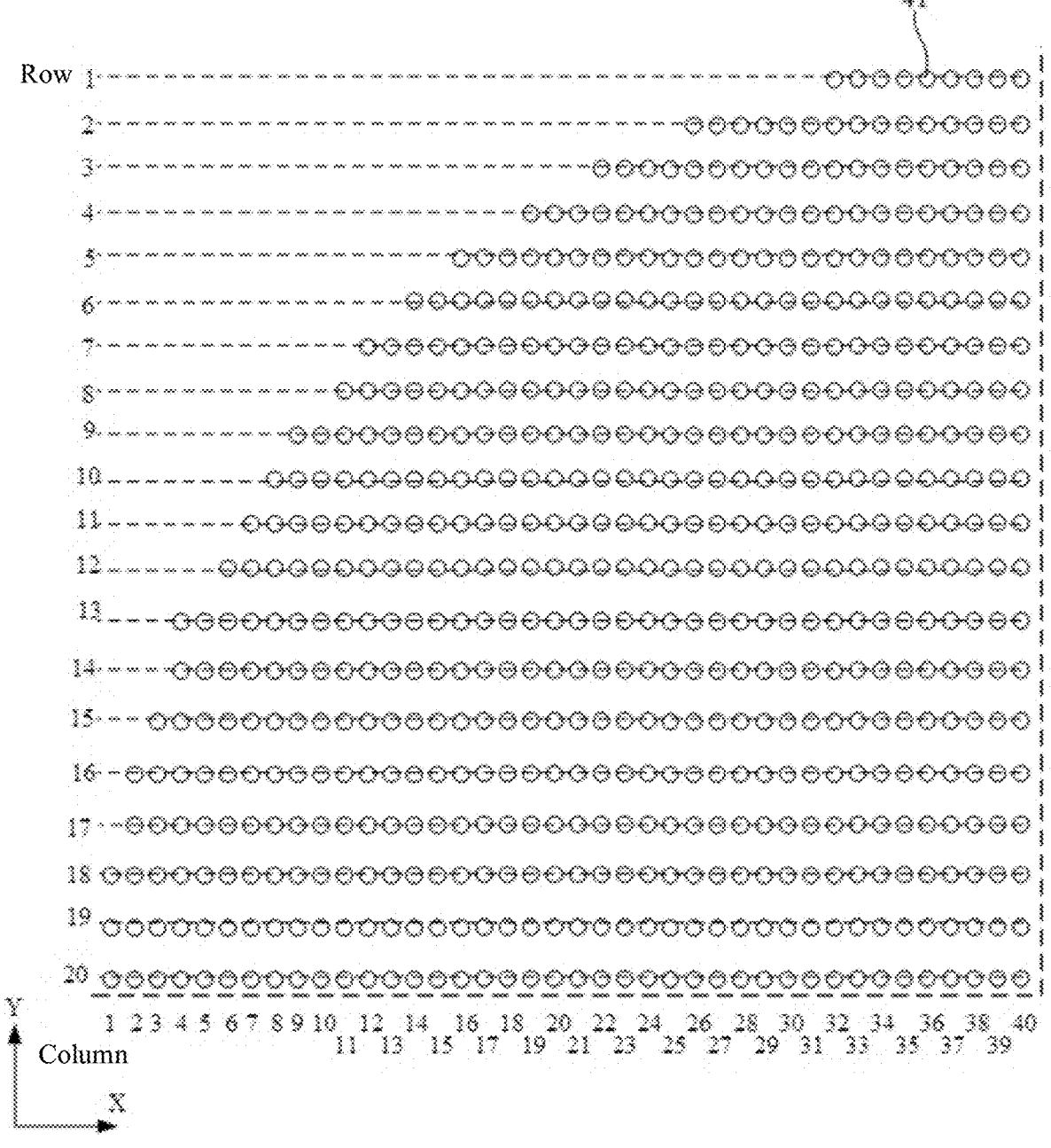
FIG. 5B is a schematic partial diagram of a first display region of a display substrate according to some exemplary embodiments of the present disclosure, in which a quarter circle portion in FIG. 5A is schematically shown.

FIG. 5A is a schematic diagram of a first display region of a display substrate according to some exemplary embodiments of the present disclosure. FIG. 5B is a schematic partial diagram of a first display region of a display substrate according to some exemplary embodiments of the present disclosure, in which a quarter circle portion in FIG. 5A is schematically shown. Referring to FIG. 3, FIG. 4A and FIG. 5A to FIG. 5B, a plurality of first light emitting devices 41 are arranged in an array in a first direction X and a second direction Y on the base substrate 1 and located in the first display region AA1. A plurality of first pixel driving circuits 51 are arranged in an array in the first direction X and the second direction Y on the base substrate 1 and located in the second display region AA2. The plurality of first pixel driving circuits 51 are used to respectively drive the plurality of first light emitting devices 41 to emit light. At least one of a plurality of connection wires 6 has one end electrically connected to at least one of the first light emitting devices 41, and the other end electrically connected to at least one of the first pixel driving circuits 51. The plurality of connection wires 6 are used to respectively transmit driving signals to the plurality of first light emitting devices 41.

In the embodiments of the present disclosure, the plurality of connection wires 6 for transmitting driving signals to all the first light emitting devices 41 are arranged in at most two transparent conductive layers. For example, the plurality of first light emitting devices 41 are arranged in a plurality of columns in the first direction X to form a plurality of pixel column groups. The plurality of pixel column groups include a first pixel column group, a second pixel column group, and a third pixel column group. The first pixel column group, the second pixel column group and the third pixel column group are arranged from an edge of the first display region AA1 to a center of the first display region AA1. The connection wire for transmitting a driving signal to the first light emitting device in the first pixel column group is located in a same transparent conductive layer as the connection wire for transmitting a driving signal to the first light emitting device in the third pixel column group are.

The inventors found through research that a number of transparent conductive layers required by the connection wires 6 is determined by an area of the first display region AA1, a number of first light emitting devices 41 provided in the first display region AA1, a line width of the connection wire 6, a spacing between connection wires 6, an arrangement of the connection wires 6 and other factors. In the related art, more than three layers of transparent conductive layers are generally required to arrange the plurality of connection wires 6, resulting in a requirement of a large number of masks and resulting in a high production cost. In the embodiments of the present disclosure, by improving the arrangement of the connection wires 6, the plurality of connection wires 6 may be arranged in at most two transparent conductive layers, so that the number of masks may be reduced and the production cost may be reduced.

Referring to FIG. 3, FIG. 4A and FIG. 5A, the plurality of first light emitting devices 41 may be arranged in 2n columns in the first direction X, and arranged in 2m rows in the second direction Y, where m and n are positive integers.

It should be noted that in the illustrated embodiment, the first display region AA1 is circular, and a region where the plurality of first light emitting devices 41 are arranged corresponds to the circular region. In this way, in the first display region AA1, one or more rows of first light emitting devices 41 arranged close to a diameter of the first display region AA1 extending in the first direction X may include 2n columns of first light emitting devices, and a plurality of rows of first light emitting devices 41 arranged away from the diameter of the first display region AA1 extending in the first direction X may include less than 2n columns of first light emitting devices. Similarly, one or more columns of first light emitting devices 41 arranged close to a diameter of the first display region AA1 extending in the second direction Y may include 2m rows of first light emitting devices, and one or more columns of first light emitting devices 41 arranged away from the diameter of the first display region AA1 extending in the second direction Y may include less than 2m rows of first light emitting devices. In the embodiments of the present disclosure, the shape of the first display region AA1 is not limited to the circle. For example, when the first display region AA1 is a rectangle, the plurality of first light emitting devices 41 may be arranged in $2m$ lines×$2n$ columns. That is, a form of the arrangement of the plurality of first light emitting devices 41 is adapted to the shape of the first display region AA1. The plurality of first light emitting devices 41 are arranged in at most 2n columns and at most 2m rows. For example, in some examples, m=20, n=40.

Herein, for ease of description, a leftmost column of first light emitting devices are referred to as a first column of light emitting devices 41, and an uppermost row of first light emitting devices are referred to as a first row of first light emitting devices 41. That is, the first column of light emitting devices are located at an edge position, for example, a left edge position, of the first display region AA1 close to the second display region AA2. The first row of light emitting devices are located at an edge position, for example, an upper edge position, of the first display region AA1 close to the second display region AA2. Accordingly, a $2n^{th}$ column of first light emitting devices are located at the other edge position, for example, a right edge position, of the first display region AA1 close to the second display region AA2. A $2m^{th}$ row of first light emitting devices are located at the other edge position, for example, a lower edge position, of the first display region AA1 close to the second display region AA2.

Referring to FIG. 3 and FIG. 4A, the second display region AA2 may include a first display sub-region AA21 and a second display sub-region AA22. The first display sub-region AA21 and the second display sub-region AA22 are located on opposite sides of the display region AA1 in the first direction X. For example, in the exemplary embodiment shown in FIG. 3, the first display sub-region AA21 and the second display sub-region AA22 are respectively located on a left side and a right side of the first display region AA1 in the first direction X.

It should be noted that the second display region AA2 may further include a third display sub-region AA23 and a fourth display sub-region AA24. For example, in the exemplary embodiment shown in FIG. 3, the third display sub-region AA23 and the fourth display sub-region AA24 are respectively located on an upper side and a lower side of the first display region AA1 in the second direction Y. In the embodiments of the present disclosure, a part of the connection wires may extend directly in the first direction X to electrically connect the first light emitting devices in the first display region AA1 with the first pixel driving circuits in the second display region AA2, and another part of the connection wires may bypass the third display sub-region AA23 or the fourth display sub-region AA24 to electrically connect the first light emitting devices located in the first display region AA1 with the first pixel driving circuits located in the second display region AA2.

In the exemplary embodiment shown in FIG. 3, a plurality of first light emitting devices 41 in a first column to an $n^{th}$ column are electrically connected to the first pixel driving circuits 51 located in the first display sub-region AA21 through some of the plurality of connection wires 6, and a plurality of first light emitting devices 41 in an $(n+1)^{th}$ column to a $2n^{th}$ column are electrically connected to the first pixel driving circuits 51 located in the second display sub-region AA22 through others of the plurality of connection wires 6. That is, the first light emitting devices 41 located in a left semicircle of the first display region AA1 are electrically connected to the first pixel driving circuits 51 located in a left portion of the second display region AA2, and the first light emitting devices 41 located in a right semicircle of the first display region AA1 are electrically connected to the first pixel driving circuits 51 located in a right portion of the second display region AA2.

Referring to FIG. 3, FIG. 4A and FIG. 5A, the first display region AA1 is circular, and the region where the plurality of first light emitting devices 41 are arranged corresponds to the circular region. The plurality of first light emitting devices 41 located in the first to $n^{th}$ columns and in the first to $2m^{th}$ rows and their related arrangements may be axisymmetric with the plurality of first light emitting devices 41 located in the $(n+1)^{th}$ to $2n^{th}$ columns and in the first to $2m^{th}$ rows and their related arrangements with respect to a first symmetry axis AX1. The plurality of first light emitting devices 41 located in the first to $m^{th}$ rows and in the first to $2n^{th}$ columns and their related arrangements may be axisymmetric with the plurality of first light emitting devices 41 located in the $(m+1)^{th}$ to $2m^{th}$ rows and in the first to $2n^{th}$ columns and their related arrangements with respect to a second symmetry axis AX2. The first symmetry axis AX1 extends in the second direction Y, and the second symmetry axis AX2 extends in the first direction X. In this case, a plurality of first light emitting devices 41 located in one quarter of the circular region may be described as an example of the embodiments of the present disclosure. For example, the plurality of first light emitting devices 41 located in an upper left quarter of the circular region may be described as an example of the embodiments of the present disclosure, and the plurality of first light emitting devices 41 located in the other three quarters of the circular region may refer to this example.

It should be noted that the embodiments of the present disclosure are not limited to this. In other embodiments, a design of axial symmetry may not be used for the plurality of first light emitting devices located in the first display region AA1.

In the embodiments of the present disclosure, the plurality of first pixel driving circuits 51 located in the first display sub-region AA21 are arranged in k columns in the first direction, and a first column of first pixel driving circuits 51 are located at an edge position of the first display sub-region AA21 close to the first display region AA1, where k is a positive integer greater than or equal to n. At least partial columns of first column to kth column of first pixel driving circuits 51 are electrically connected to the first to $n^{th}$ column of first light emitting devices 41 through the connection wires 6. Specifically, in the first display sub-region AA21, the first column of first pixel driving circuits 51 is a column of first pixel driving circuits closest to the first display region AA1, that is, located on a right side of the first display sub-region AA21 in FIG. 3. The first column of first light emitting devices 41 are electrically connected to the first column of pixel driving circuits 51 closest to the first column of first light emitting devices 41 through the connection wires 6. By analogy, a second column of first light emitting devices 41 are electrically connected to a second column of first pixel driving circuits 51 through the connection wires 6, a third column of first light emitting devices 41 is electrically connected to a third column of first pixel driving circuits 51 through the connection wires 6, . . . , the $n^{th}$ column of first light emitting devices 41 is electrically connected to the $n^{th}$ column of first pixel driving circuits 51 through the connection wires 6. In this way, it is advantageous to arrange all the connection wires in at most two transparent conductive layers.

Figure 6:
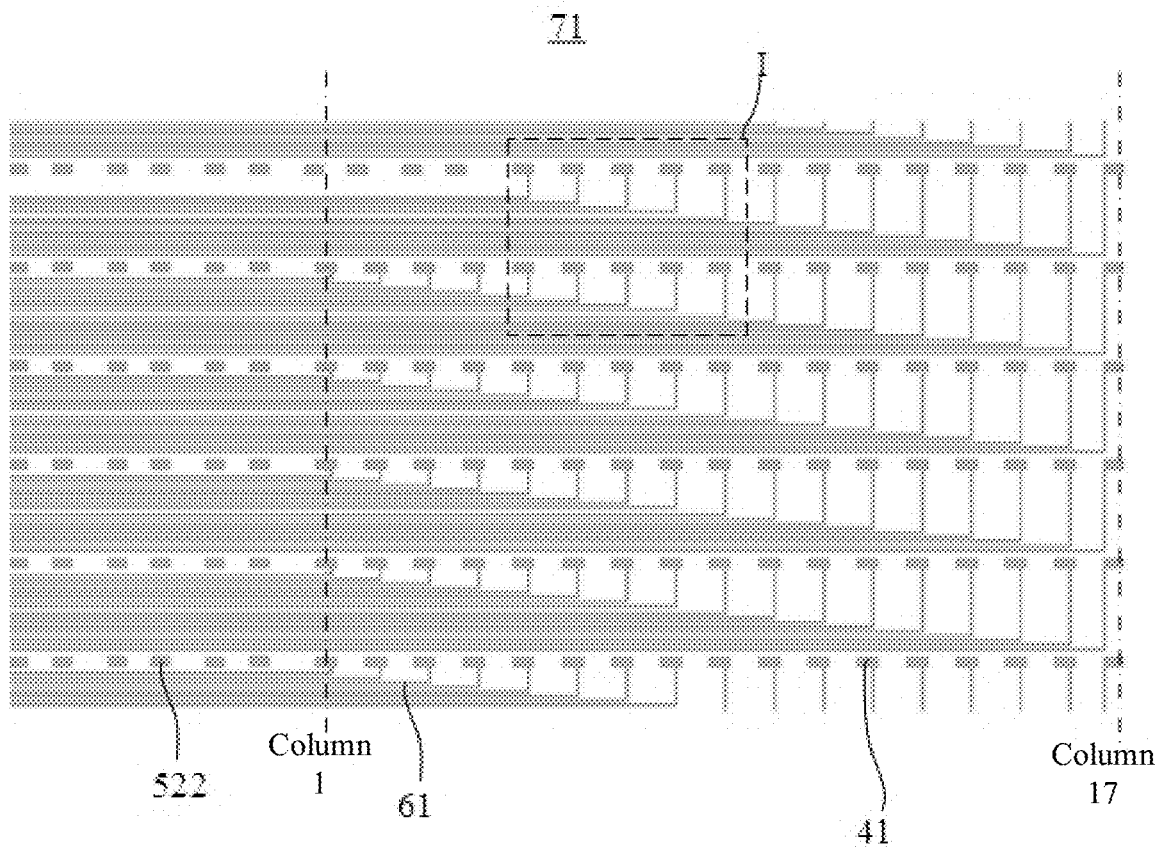
FIG. 6 is a schematic diagram of a first connection wire in a first transparent conductive layer included in a display substrate according to some exemplary embodiments of the present disclosure.
Figure 7:
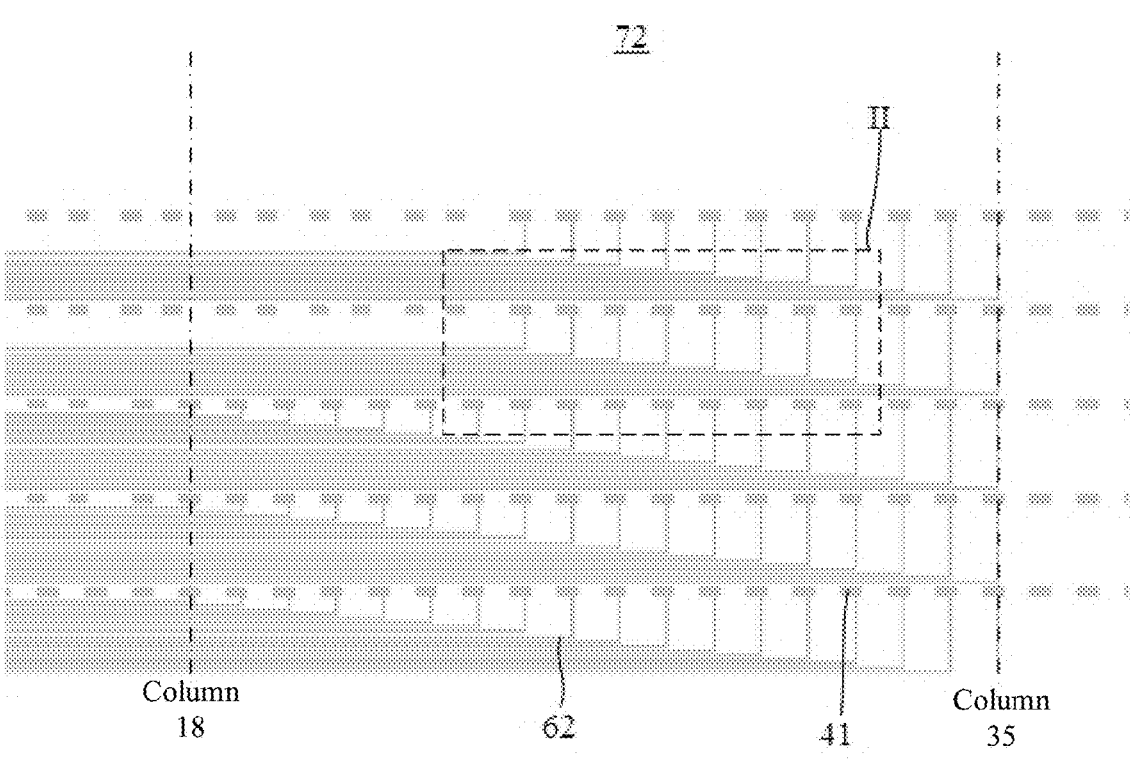
FIG. 7 is a schematic diagram of a second connection wire in a second transparent conductive layer included in a display substrate according to some exemplary embodiments of the present disclosure.
Figure 8:
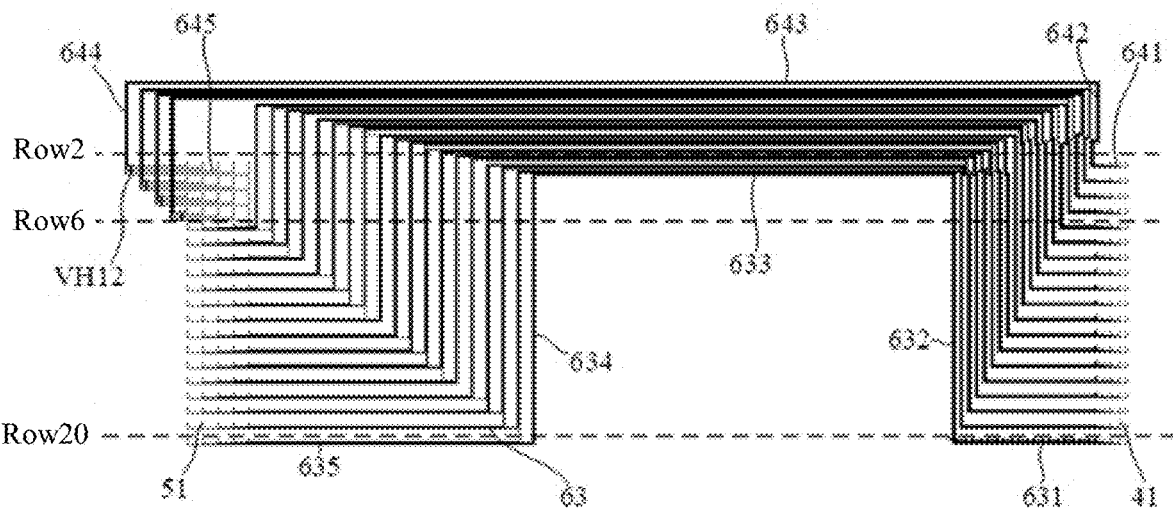
FIG. 8 is a schematic diagram of a third connection wire and a fourth connection wire included in a display substrate according to some exemplary embodiments of the present disclosure.
Figure 9A:
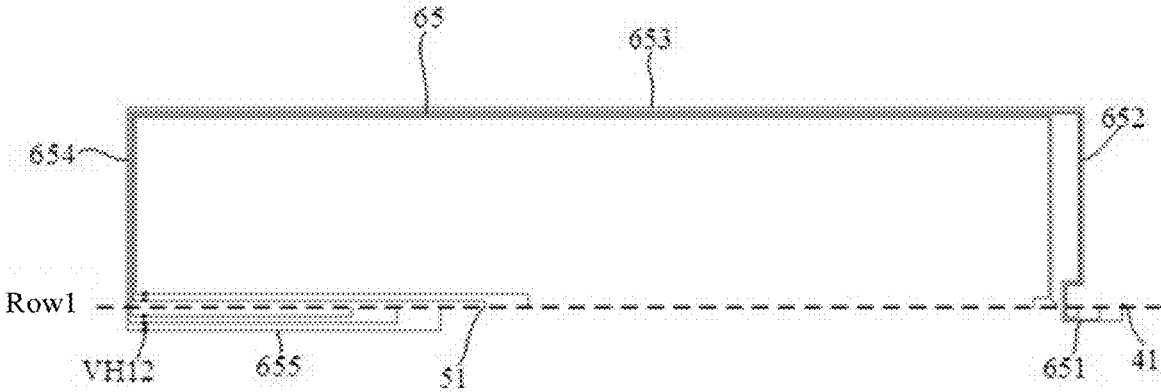
FIG. 9A and FIG. 9B are respectively schematic diagrams of a fifth connection wire included in a display substrate according to some exemplary embodiments of the present disclosure.
Figure 9B:
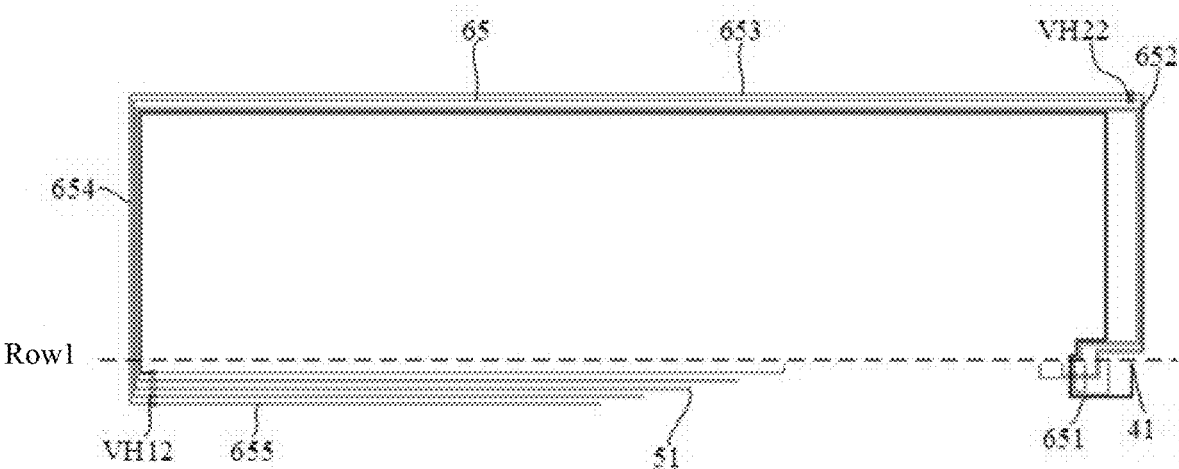
Figure 10:
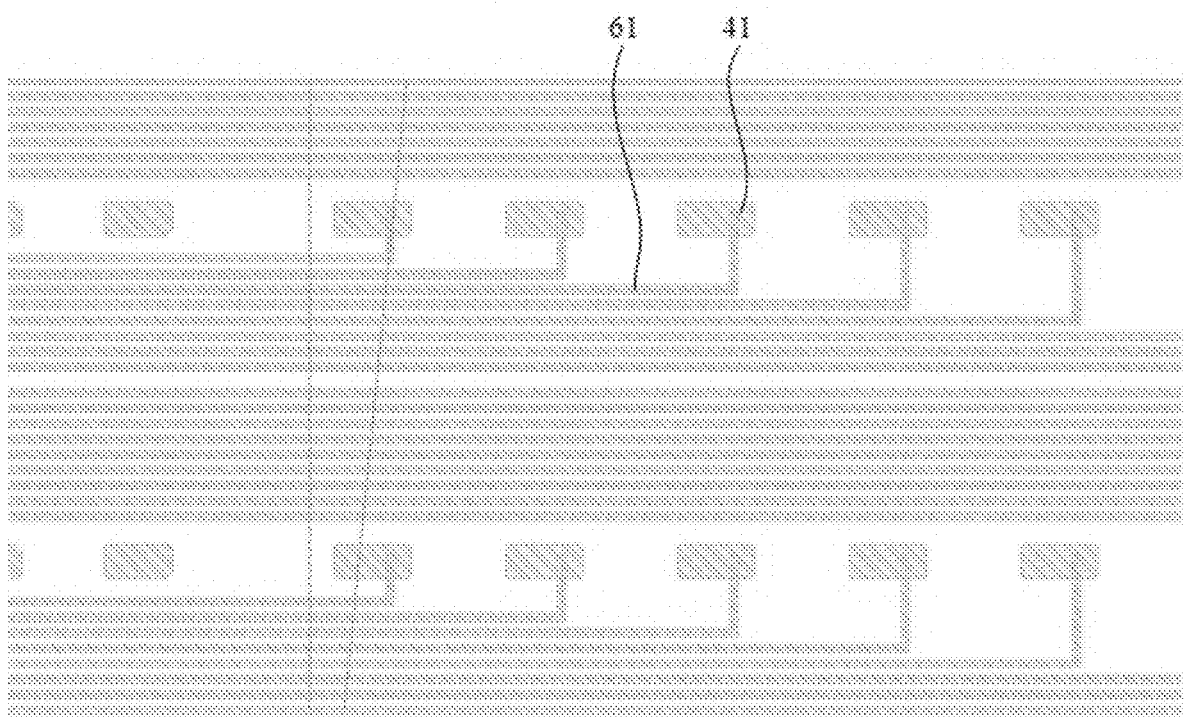
FIG. 10 is a partial enlarged view of part I in FIG. 6.
Figure 11:
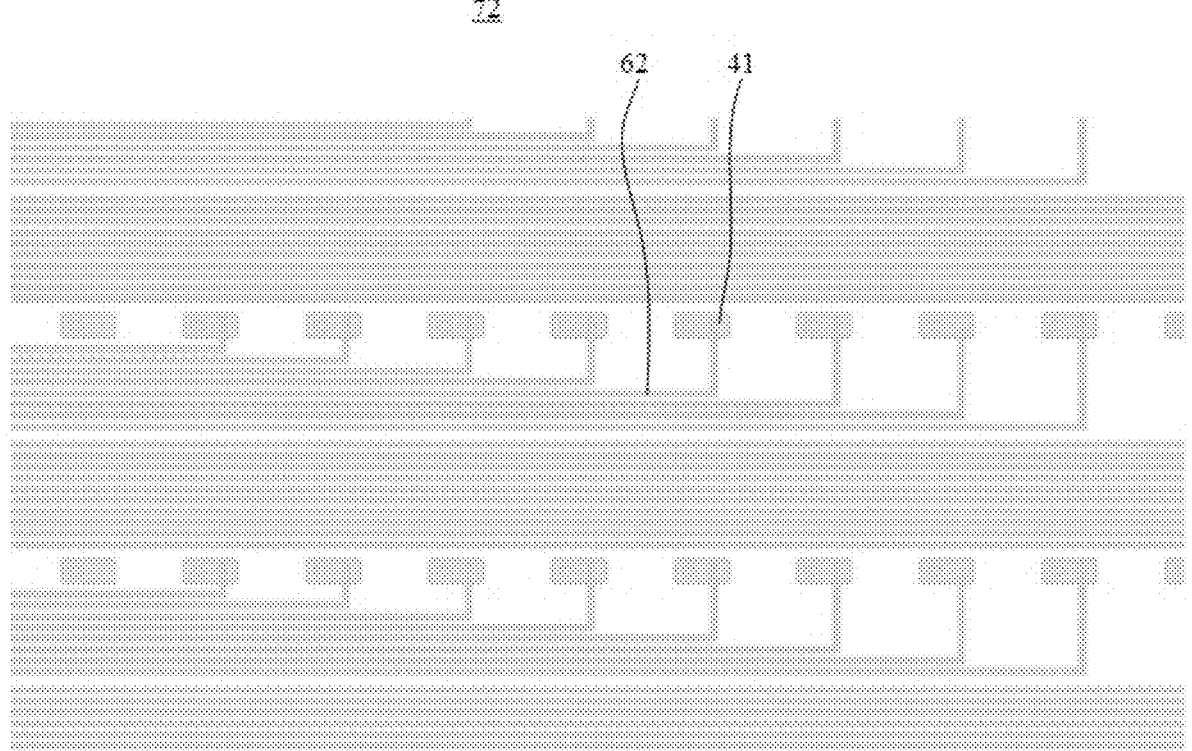
FIG. 11 is a partial enlarged view of part II in FIG. 7.
Figure 12:
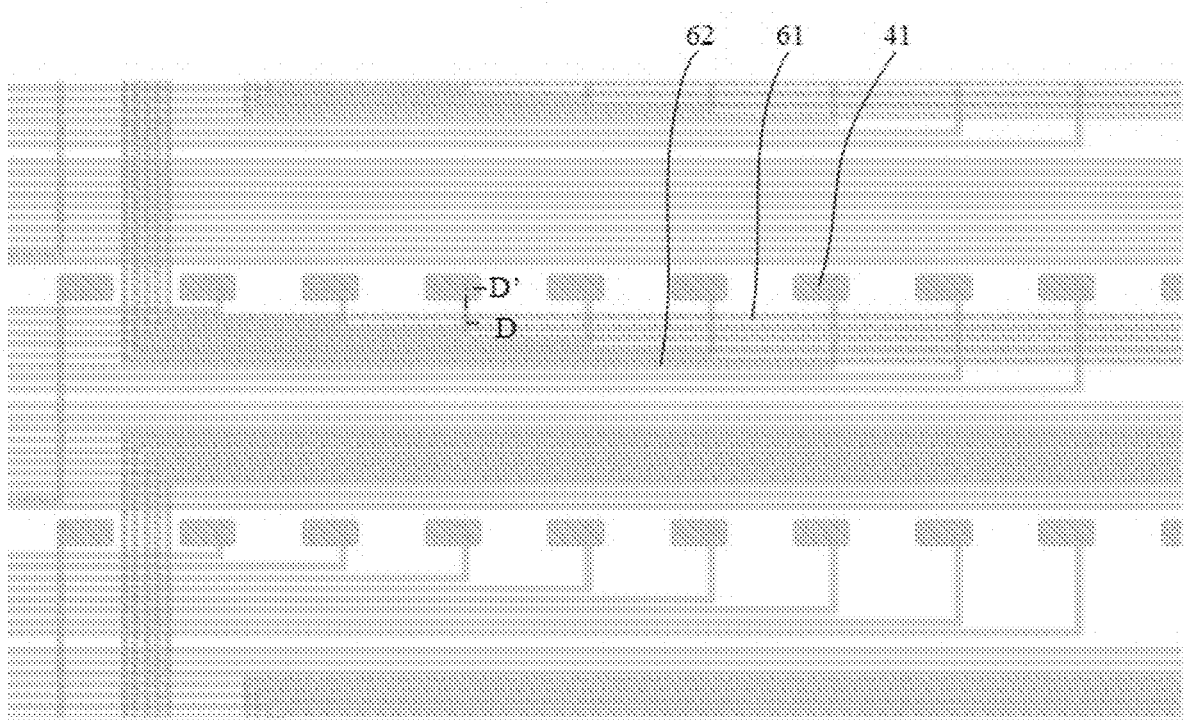
FIG. 12 is a partial enlarged view of partial connection wires located in the first transparent conductive layer and the second transparent conductive layer.
Figure 13:
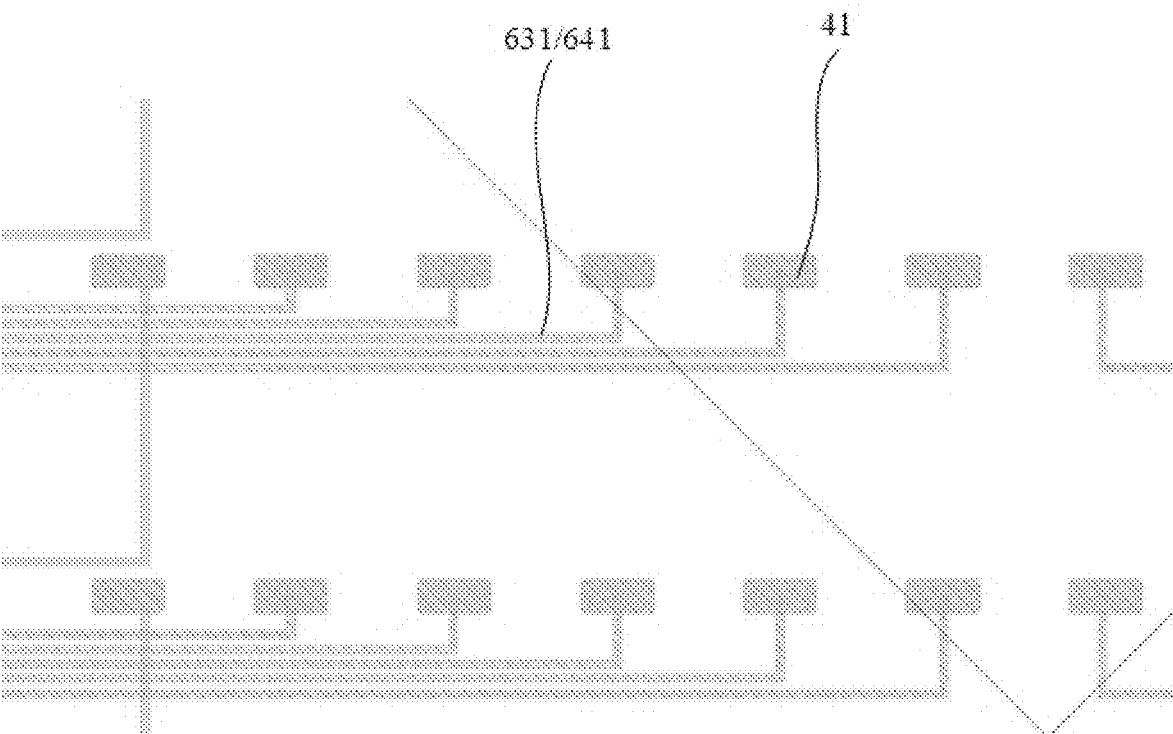
FIG. 13 is a partial enlarged view of a third connection wire or a fourth connection wire included in a display substrate according to some exemplary embodiments of the present disclosure, which corresponds to a portion of the connection wire connected to a first light emitting device.
Figure 14:
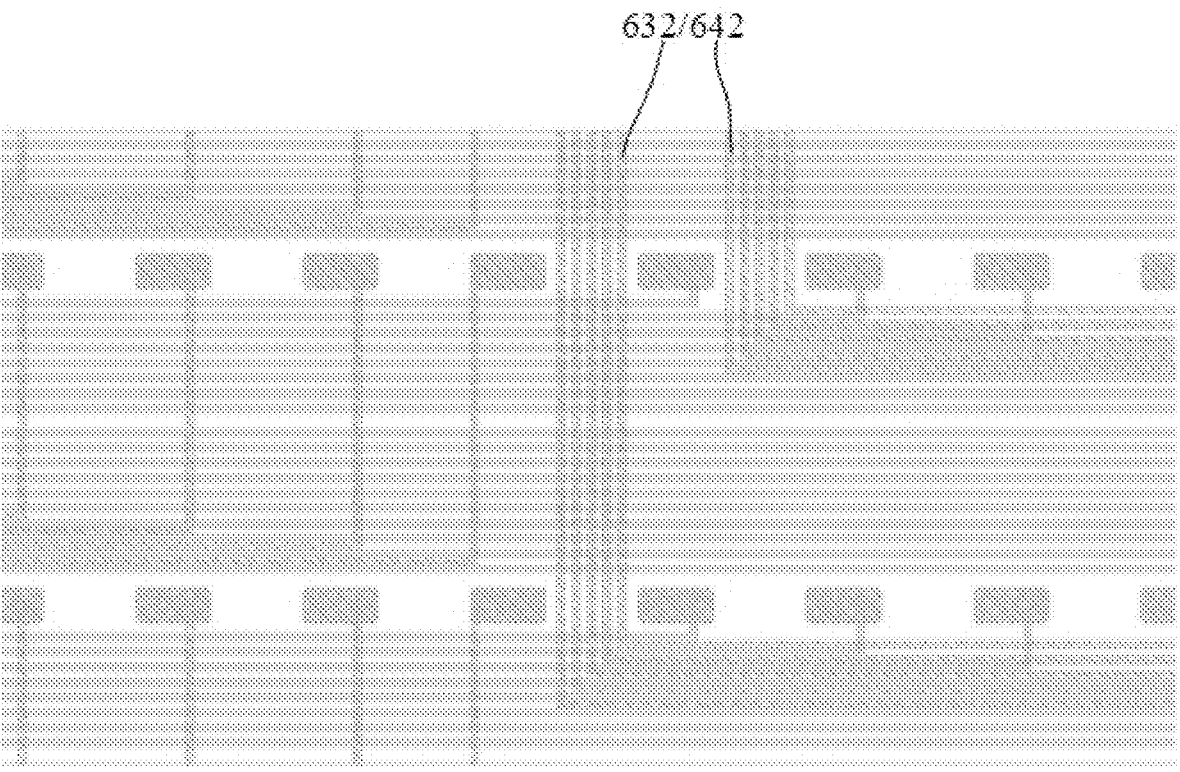
FIG. 14 is a partial enlarged view of a third connection wire or a fourth connection wire included in a display substrate according to some exemplary embodiments of the present disclosure, which corresponds to an upward turning portion of the connection wire.
Figure 15:
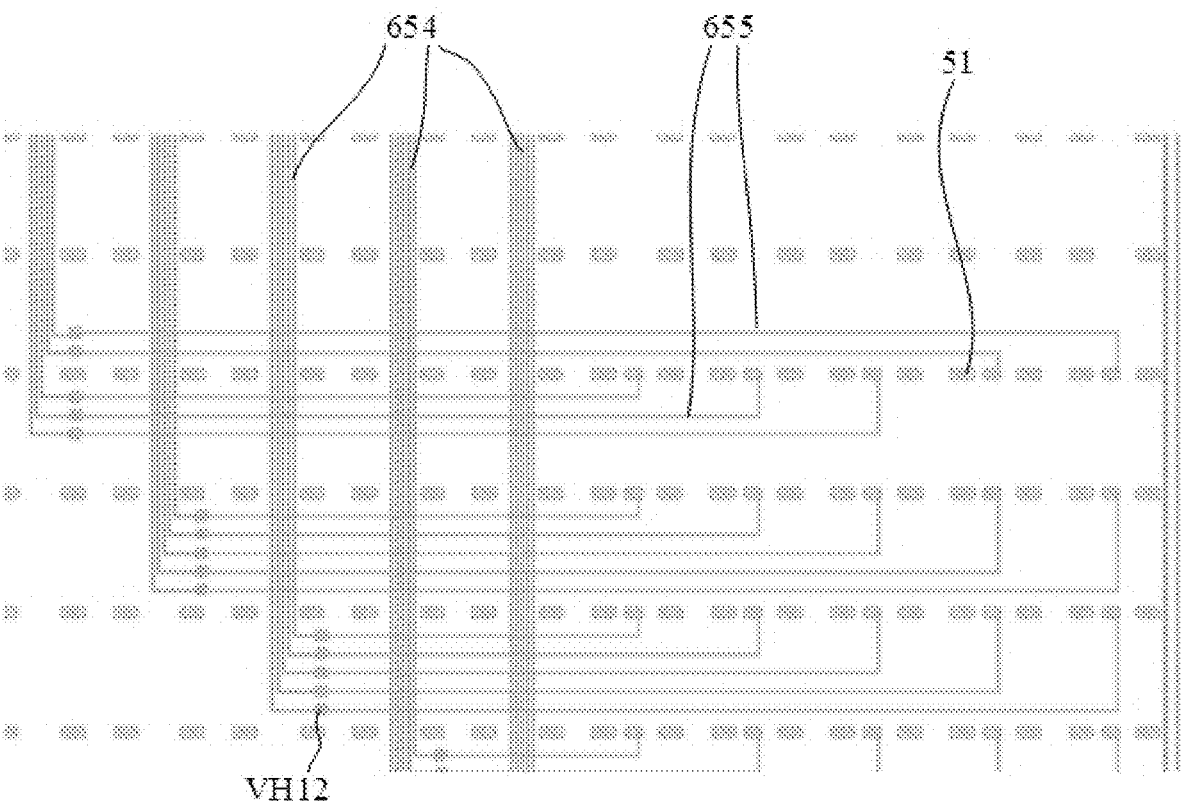
FIG. 15 is a partial enlarged view of a fifth connection wire included in a display substrate according to some exemplary embodiments of the present disclosure, which corresponds to position III in FIG. 9A.
Figure 16:
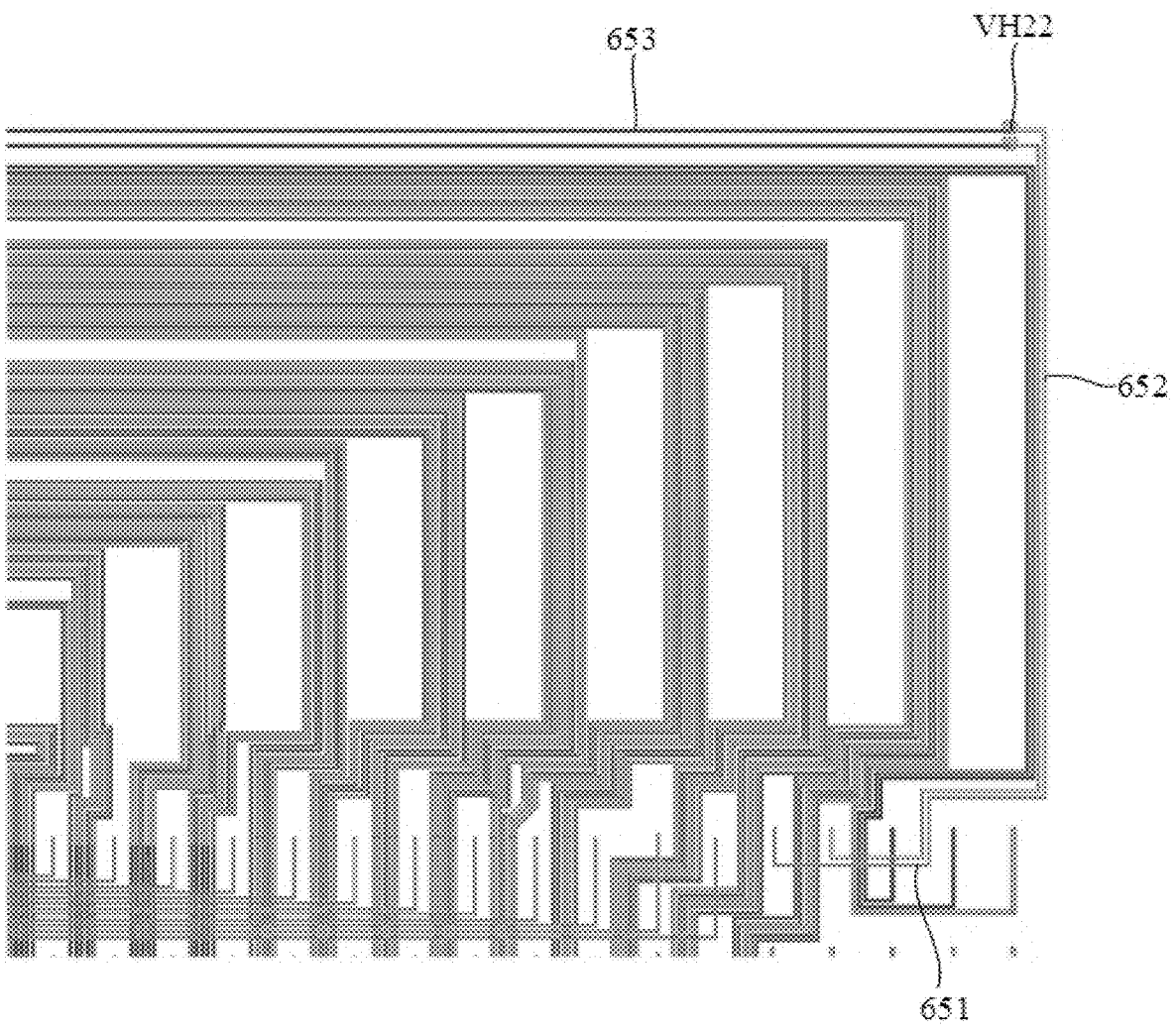
FIG. 16 is a partial enlarged view of a fifth connection wire included in a display substrate according to some exemplary embodiments of the present disclosure, which corresponds to position IV in FIG. 9B.
Figure 17:
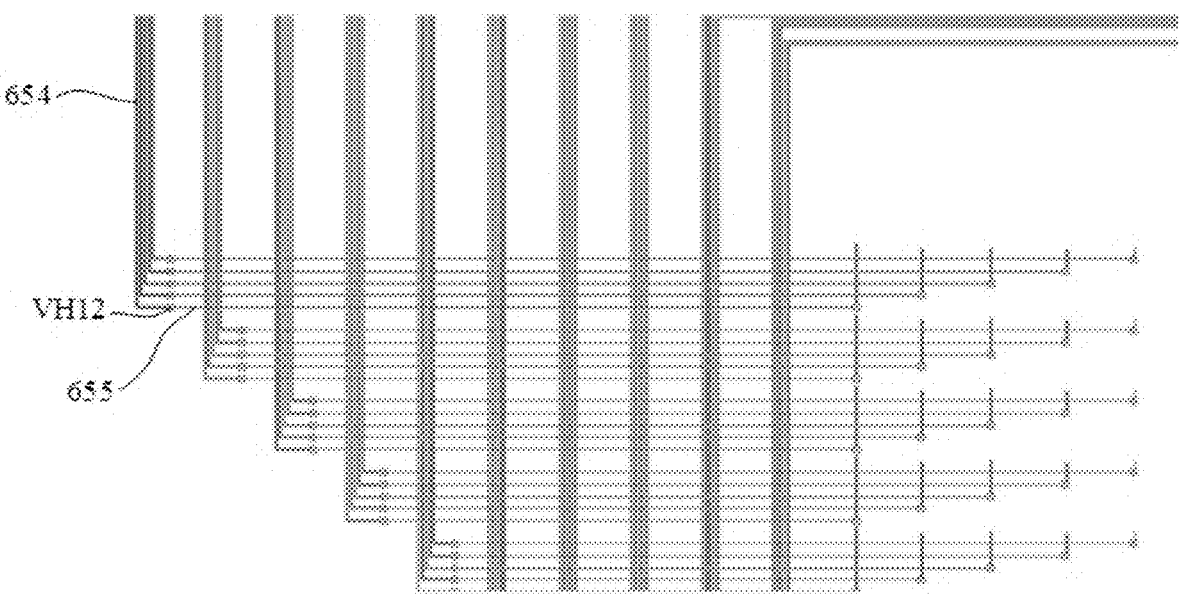
FIG. 17 is a partial enlarged view of a fifth connection wire included in a display substrate according to some exemplary embodiments of the present disclosure, which corresponds to position V in FIG. 9B.

FIG. 6 is a schematic diagram of a first connection wire in a first transparent conductive layer included in the display substrate according to some exemplary embodiments of the present disclosure. FIG. 7 is a schematic diagram of a second connection wire in a second transparent conductive layer included in the display substrate according to some exemplary embodiments of the present disclosure. FIG. 8 is a schematic diagram of a third connection wire and a fourth connection wire included in the display substrate according to some exemplary embodiments of the present disclosure. FIG. 9A and FIG. 9B are respectively schematic diagrams of a fifth connection wire included in the display substrate according to some exemplary embodiments of the present disclosure. FIG. 10 is a partial enlarged view of part I in FIG. 6. FIG. 11 is a partial enlarged view of part II in FIG. 7. FIG. 12 is a partial enlarged view of partial connection wires located in the first transparent conductive layer and the second transparent conductive layer. FIG. 13 is a partial enlarged view of the third connection wire or the fourth connection wire included in the display substrate according to some exemplary embodiments of the present disclosure, which corresponds to a portion of the connection wire connected to the first light emitting device. FIG. 14 is a partial enlarged view of the third connection wire or the fourth connection wire included in the display substrate according to some exemplary embodiments of the present disclosure, which corresponds to an upward turning portion of the connection wire. FIG. 15 is a partial enlarged view of the fifth connection wire included in the display substrate according to some exemplary embodiments of the present disclosure, which corresponds to position III in FIG. 9A. FIG. 16 is a partial enlarged view of the fifth connection wire included in the display substrate according to some exemplary embodiments of the present disclosure, which corresponds to position IV in FIG. 9B. FIG. 17 is a partial enlarged view of the fifth connection wire included in the display substrate according to some exemplary embodiments of the present disclosure, which corresponds to position V in FIG. 9B.

Referring to FIG. 1 to FIG. 17, the plurality of connection wires 6 may include first connection wires 61 and second connection wires 62.

The first light emitting devices 41 located in the first column to an $n_1^{th}$ column are electrically connected to corresponding first pixel driving circuits 51 through first connection wires 61, and the first light emitting devices 41 located in an $(n_1+1)^{th}$ column to an $n_2^{th}$ column are electrically connected to corresponding first pixel driving circuits 51 through second connection wires 62, where $1 < n_1 < n_2 < n$, and $n_1$ and $n_2$ are positive integers. For example, in some examples, $n_1=17$, $n_2=35$. That is, the first pixel column group includes the first light emitting devices in the first column to the $n_1{}^{th}$ column, and the second pixel column group includes the first light emitting devices in the $(n_1+1)^{th}$ column to the $n_2{}^{th}$ column.

For example, the at most two transparent conductive layers include a first transparent conductive layer 71 and a second transparent conductive layer 72. The first connection wires 61 are located in the first transparent conductive layer 71, and the second connection wires 62 are located in the second transparent conductive layer 72.

It should be noted that in FIG. 4A, in order to distinguish a part of the connection wires in the first transparent conductive layer from another part of the connection wires in the second transparent conductive layer, the part of the connection wires in the first transparent conductive layer is represented by a thick solid line, and the part of the connection wires in the second transparent conductive layer is represented by a thin dotted line. As shown in FIG. 4A, at least partial connection wires for transmitting driving signals to the first light emitting devices in the first pixel column group and at least partial connection wires for transmitting driving signals to the first light emitting devices in the third pixel column group are located in a same transparent conductive layer (e.g., the first transparent conductive layer), and the connection wires for transmitting driving signals to the first light emitting devices in the second pixel column group are located in the other transparent conductive layer (e.g., the second transparent conductive layer).

In the embodiments of the present disclosure, the connection wires for providing driving signals to a part of columns of first light emitting devices are arranged in the first transparent conductive layer, and the connection wires for providing driving signals to the other part of columns of first light emitting devices are arranged in the second transparent conductive layer, which is conducive to arranging the connection wires in at most two transparent conductive layers.

Figure 23:
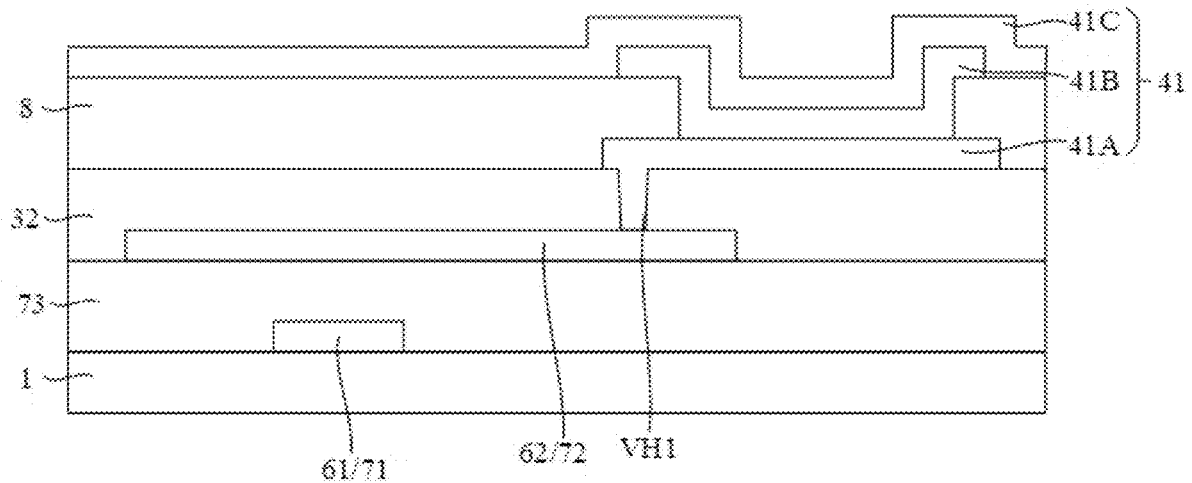
FIG. 23 is a cross-sectional view of the display substrate according to some exemplary embodiments of the present disclosure taken along line DD' in FIG. 12.

FIG. 23 is a cross-sectional view of the display substrate according to some exemplary embodiments of the present disclosure taken along line DD' in FIG. 12. Referring to FIG. 23, the first transparent conductive layer 71 may be provided on the base substrate 1, the second transparent conductive layer 72 may be provided on a side of the first transparent conductive layer 71 away from the base substrate 1, and a wire insulation layer 73 may be provided between the first transparent conductive layer 71 and the second transparent conductive layer 72.

Referring to FIG. 3 and FIG. 4A, the first connection wire 61 and the second connection wire 62 both extend through the first display region AA1 and the second display region AA2 in the first direction X, or extend through a border region between the first display region AA1 and the second display region AA2. In this way, it is advantageous for the layout of the first connection wire 61 and the second connection wire 62.

Figure 18:
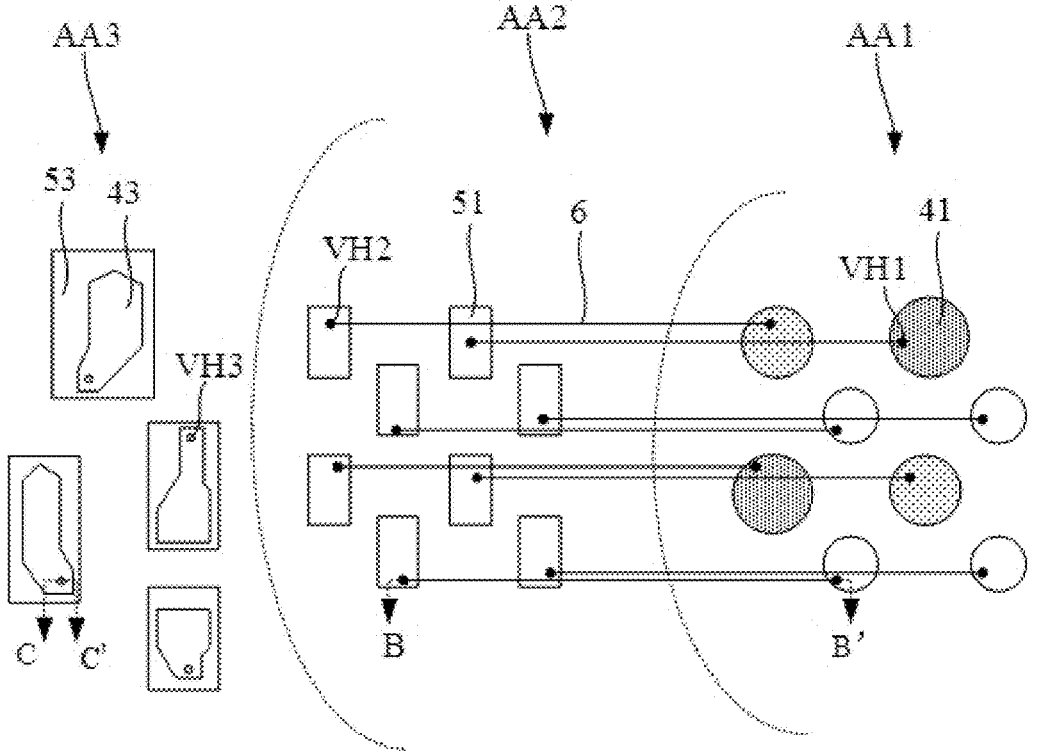
FIG. 18 schematically shows a partial enlarged view of three display regions of a display substrate according to the embodiments of the present disclosure.

FIG. 18 schematically shows a partial enlarged view of three display regions of the display substrate according to embodiments of the present disclosure. In FIG. 18, only an enlarged view of a region including a column of first pixel driving circuits, a column of first light emitting devices, a column of third pixel driving circuits and a column of third light emitting devices is shown. It should be noted that, in order to clearly reflect a connection between the first pixel driving circuit and the first light emitting device, FIG. 18 shows that adjacent first pixel driving circuit and first light emitting device are connected to each other. However, it may be understood that other first light emitting devices not shown may be further provided on the left side of the first light emitting device in FIG. 18, and other first pixel driving circuits not shown may be further provided on the right side of the first pixel driving circuit.

For example, as shown in FIG. 18, the second display region AA2 includes at least one (e.g., a plurality of) first pixel driving circuits 51. For example, the first light emitting devices 41 are electrically connected to the first pixel driving circuits 51 in one-to-one correspondence, and the plurality of first pixel driving circuits 51 are used to drive the plurality of first light emitting devices 41 in one-to-one correspondence. For example, a rectangular box shown in FIG. 18 (a white filled region with a black box, which is indicated by a reference numeral 51) represents the first pixel driving circuit 51. For example, the first pixel driving circuits 51 are configured to drive the plurality of first light emitting devices 41 in one-to-one correspondence to emit light. That is, one first pixel driving circuit 51 drives one corresponding first light emitting device 41, and different first pixel driving circuits 51 drive different first light emitting devices 41.

As shown in FIG. 18, the third display region AA3 further includes at least one (e.g., a plurality of) third light emitting device 43 and at least one (e.g., a plurality of) third pixel driving circuit 53. The third light emitting devices 43 are electrically connected to the third pixel driving circuits 53 in one-to-one correspondence, and the third pixel driving circuits 53 are used to drive the third light emitting devices 43 to emit light.

It should be noted that, in FIG. 18, rectangular boxes indicated by reference numerals 51 and 53 are merely used to show approximate positions of the first pixel driving circuit 51 and the second pixel driving circuit 53, rather than indicating their specific shapes and specific boundaries.

In the embodiments of the present disclosure, the pixel driving circuits for driving each sub-pixel in the third display region AA3 are located in the third display region AA3. For example, orthographic projections of the third light emitting devices 43 on the base substrate 1 at least partially overlaps with orthographic projections of the third pixel driving circuits 53 on the base substrate 1. This is advantageous to electrically connect each light emitting device 43 located in the third display region AA3 with the corresponding third pixel driving circuit 53.

The first light emitting device 41 is provided with the driving signal by the first pixel driving circuit 51 located in the same row. In this way, the first connection wires 61 and the second connection wires 62 extend mainly in the first direction X, that is, the first connection wires 61 and the second connection wires 62 may be routed directly in the horizontal direction.

Referring to FIG. 18, one end of the connection wire 6 is electrically connected to at least one first light emitting device 41 through a first connection via hole VH1, and the other end of the connection wire is electrically connected to at least one first pixel driving circuit 51 through a second connection via hole VH2. In this way, the plurality of connection wires 6 may be used to respectively transmit driving signals to the plurality of first light emitting devices 41.

The third light emitting device 43 and the third pixel driving circuit 53 are both located in the third display region AA3. The orthographic projection of the third light emitting device 43 on the base substrate 1 at least partially overlaps with the orthographic projection of the third pixel driving circuit 53 for driving the third light emitting device 43 on the base substrate 1. The third light emitting device 43 is electrically connected to the third pixel driving circuit 53 beneath the third light emitting device through a third via hole VH3.

Referring to FIG. 6, a first conductive structure 522 is further provided in the first transparent conductive layer 71. The first conductive structure 522 is located in the second display region AA2. For example, in the second display region AA2, at least a part of the second light emitting devices 42 may be electrically connected to the second pixel driving circuits 52 through the first conductive structure 522.

Referring back to FIG. 3, FIG. 4A and FIG. 8, the plurality of connection wires 6 further include a third connection wire 63. For example, the first light emitting devices 41 located in a $(n_2+1)^{th}$ to the $n^{th}$ columns and in a $(m_1+1)^{th}$ to the $m^{th}$ rows are electrically connected to the corresponding first pixel driving circuits 51 through the third connection wire 63, where $1<m_1<m$, and $m_1$ is a positive integer. In some examples, $m_1=5$. That is, the third pixel column group includes the first light emitting devices located in the $(n_2+1)^{th}$ to the $n^{th}$ columns and in the $(m_1+1)^{th}$ to the $m^{th}$ rows.

The third connection wire 63 extends through the border region between the first display region AA1 and the second display region AA2 in the second direction Y. For example, the third connection wire 63 may be routed from above or below the first display region AA1, and then electrically connected to the first pixel driving circuit 51.

In the embodiments of the present disclosure, the third connection wire 63 is located in only one of the first transparent conductive layer 71 and the second transparent conductive layer 72. For example, the third connection wire 63 is only located in the first transparent conductive layer 71.

Referring to FIG. 8, FIG. 13 and FIG. 14, the third connection wire 63 includes a first part 631, a second part 632, a third part 633, a fourth part 634 and a fifth part 635 connected in sequence. The first part 631 of the third connection wire extends in the first direction X and is completely located in the first display region AA1. The second part 632 of the third connection wire extends in the second direction Y and extends from the first display region AA1 to the second display region AA2. The third part 633 of the third connection wire extends in the first direction X. The fourth part 634 of the third connection wire extends in the second direction Y. The fifth part 635 of the third connection wire extends in the first direction X. The third part 633, the fourth part 634 and the fifth part 635 of the third connection wire are all located in the second display region AA2. In this way, the third connection wire 63 may be formed into a "L" shape. In the example of FIG. 8, the second part 632 of the third connection wire extends upward in the second direction Y through the border region between the first display region AA1 and the second display region AA2. Accordingly, as shown in FIG. 4A, the second part 632 of some other third connection wires extends downward in the second direction Y through the border region between the first display region AA1 and the second display region AA2.

In the embodiments of the present disclosure, the third connection wire includes a first part 631, a second part 632 and a third part 633. The first part 631 of the third connection wire extends in the first direction X and is completely located in the first display region AA1. The second part 632 of the third connection wire extends in the second direction Y and extends from the first display region AA1 to the second display region AA2. The third part 633 of the third connection wire extends in the second display region AA2 in the first direction X. The third part 633 of the third connection wire and the first connection wire 61 are arranged at intervals in the second direction Y. An extension line of the third part 633 of the third connection wire in the first direction X does not pass through the first display region AA1. The third part 633 of the third connection wire may extend in the third display sub-region AA23 or the fourth display sub-region AA24.

In the embodiments of the present disclosure, the connection wires for providing driving signals to the first light emitting devices in the columns close to a center region of the first display region are routed from above and below the first display region, so as to avoid a conflict with the first connection wires and the second connection wires described above, and facilitate a layout of the third connection wire. In this way, all the connection wires are arranged in at most two transparent conductive layers.

Continuing to refer to FIG. 3, FIG. 4A and FIG. 8, the plurality of connection wires 6 further include a fourth connection wire 64. The first light emitting devices 41 located in the $(n_2+1)^{th}$ to the $n^{th}$ columns and in a $(m_2+1)^{th}$ to the $m_1^{th}$ rows are electrically connected to the corresponding first pixel driving circuits 51 through the fourth connection wires 64, where $1\leq m_2<m_1-1$, and $m_2$ is a positive integer. For example, $m_2=1$.

In the embodiments of the present disclosure, a part of the fourth connection wire 64 is located in the first transparent conductive layer 71, and the other part of the fourth connection wire 64 is located in the second transparent conductive layer 72.

Referring to FIG. 8, FIG. 13 and FIG. 14, the fourth connection wire 64 includes a first part 641, a second part 642, a third part 643, a fourth part 644 and a fifth part 645 connected in sequence. The first part 641 of the fourth connection wire extends in the first direction X and is completely located in the first display region AA1. The second part 642 of the fourth connection wire extends in the second direction Y and extends from the first display region AA1 to the second display region AA2. The third part 643 of the fourth connection wire extends in the first direction X. The fourth part 644 of the fourth connection wire extends in the second direction Y. The fifth part 645 of the fourth connection wire extends in the first direction X. The third part 643, the fourth part 644 and the fifth part 645 are all located in the second display region AA2.

In some exemplary embodiments of the present disclosure, the first part 641, the second part 642, the third part 643 and the fourth part 644 of the fourth connection wire are all located in the first transparent conductive layer 71, and the fifth part 645 of the fourth connection wire is located in the second transparent conductive layer 72.

For example, since the fourth part 644 and the fifth part 645 of the fourth connection wire are located in different transparent conductive layers, the fourth part 644 may be electrically connected to the fifth part 645 of the same fourth connection wire through a third connection via hole VH12.

In the embodiments of the present disclosure, the connection wires for providing driving signals to the first light emitting devices in a column close to the center region of the first display region and in a row close to the edge of the first display region are routed from above and below the first display region, and a part of the connection wire connected to the first pixel driving circuit is arranged in the second transparent conductive layer to facilitate a wiring of the fourth connection wire, which is advantageous to arrange all the connection wires in at most two transparent conductive layers.

Referring to FIG. 3, FIG. 4A, FIG. 9A, FIG. 9B and FIG. 15 to FIG. 17, the plurality of connection wires 6 further include a fifth connection wire 65. The first light emitting devices 41 located in the $(n_2+1)^{th}$ to the $n^{th}$ columns and in the first to the $m_2^{th}$ rows are electrically connected to the corresponding first pixel driving circuits 51 through the fifth connection wire 65.

In some exemplary embodiments of the present disclosure, a part of the fifth connection wire 65 is located in the first transparent conductive layer 71, and the other part of the fifth connection wire 65 is located in the second transparent conductive layer 72.

Specifically, the fifth connection wire 65 includes a first part 651, a second part 652, a third part 653, a fourth part 654 and a fifth part 656 connected in sequence. The first part 651 of the fifth connection wire extends in the first direction X and is completely located in the first display region AA1. The second part 652 of the fifth connection wire extends in the second direction Y and extends from the first display region AA1 to the second display region AA2. The third part 653 of the fifth connection wire extends in the first direction X. The fourth part 654 of the fifth connection wire extends in the second direction Y. The fifth part 655 of the fifth connection wire extends in the first direction X. The third part 651, the fourth part 652 and the fifth part 655 of the fifth connection wire are all located in the second display region AA2.

Referring to FIG. 9A and FIG. 15, the first part 651, the second part 652, the third part 653 and the fourth part 654 of the fifth connection wire are all located in the first transparent conductive layer 71, and the fifth part 655 of the fifth connection wire is located in the second transparent conductive layer 72.

For example, referring to FIG. 15, in the embodiment, for a plurality of fifth connection wires 65 for providing driving signals to the first light emitting devices 41 located in the $(n_2+1)^{th}$ to the $n^{th}$ columns and in the first to the $m_2^{th}$ rows, the fifth parts of a part of fifth connection wires 65 (for example, two fifth connection wires as shown in FIG. 15) extend above the row where the first pixel driving circuits 51 are located, and then are electrically connected to the corresponding first pixel driving circuits 51 from above; the fifth parts 655 of another part of fifth connection wires 65 (for example, three fifth connection wires as shown in FIG. 15) extend below the row where the first pixel driving circuits 51 are located, and then are electrically connected to the corresponding first pixel driving circuits 51 from below. More specifically, the fifth parts 655 of the two fifth connection wires 65 for providing driving signals to the first light emitting devices 41 located in the $(n_2+1)^{th}$ to $(n_2+2)^{th}$ columns and in the first to the $m_2^{th}$ rows extend above the row where the first pixel driving circuits 51 are located, and then are electrically connected to the corresponding first pixel driving circuits 51 from above; the fifth parts 655 of a plurality of (e.g., three) fifth connection wires 65 for providing driving signals to the first light emitting devices 41 located in $(n_2+3)^{th}$ to the $n^{th}$ columns and in the first to the $m_2^{th}$ rows extend below the row where the first pixel driving circuits 51 are located, and then are electrically connected to the corresponding first pixel driving circuits 51 from below.

For example, since the fourth part 654 and the fifth part 655 of the fifth connection wire are located in different transparent conductive layers, the fourth part 654 may be electrically connected to the fifth part 655 of the same fifth connection wire through the third connection via hole VH12.

Referring to FIG. 9B and FIG. 16, for a plurality of fifth connection wires 65 for providing driving signals to the first light emitting devices located in the $(n_2+1)^{th}$ to the $n^{th}$ columns and in the first to the $m_2^{th}$ rows, the first parts 651 and the second parts 652 of a part fifth connection wires are located in the first transparent conductive layer 71, and the first parts 651 and the second parts 652 of another part of fifth connection wires are located in the second transparent conductive layer 72. For example, the first parts 651 and the second parts 652 of two fifth connection wires 65 for providing driving signals to the first light emitting devices 41 located in the $(n_2+1)^{th}$ to the $(n_2+2)^{th}$ columns and in the first to the $m_2^{th}$ rows are located in the first transparent conductive layer 71, and the first parts 651 and the second parts 652 of a plurality of (e.g., three) fifth connection wires 65 for providing driving signals to the first light emitting devices 41 located in the $(n_2+3)^{th}$ to the $n^{th}$ columns and in the first to the $m_2^{th}$ rows are located in the second transparent conductive layer 72.

For example, since the second part 652 and the third part 653 of the fifth connection wire are located in different transparent conductive layers, the second part 652 may be electrically connected to the third part 653 of the same fifth connection wire through a fourth connection via hole VH22.

Referring to FIG. 9B and FIG. 17, in the embodiment, for a plurality of fifth connection wires for providing driving signals to the first light emitting devices located in the $(n_2+1)^{th}$ to the $n^{th}$ columns and in the first to the $m_2^{th}$ rows, the third parts 653 and the fourth parts 654 of all the fifth connection wires 65 are located in the first transparent conductive layer 71, and the fifth parts 655 of all the fifth connection wires 65 are located in the second transparent conductive layer 72. For example, the fifth parts 655 of all the fifth connection wires 65 extend below the row where the first pixel driving circuits 51 are located, and then are electrically connected to the corresponding first pixel driving circuits 51 from below.

For example, since the fourth part 654 and the fifth part 655 of the fifth connection wire are located in different transparent conductive layers, the fourth part 654 may be electrically connected to the fifth part 655 of the same fifth connection wire through the third connection via hole VH12.

In the embodiments of the present disclosure, the connection wires for providing driving signals to the first light emitting devices in a column close to the center region of the first display region and in the row closest to the edge of the first display region are routed from above and below the first display region, and the layout of the fifth connection wire is specially designed, so as to facilitate achieving the arrangement of all the connection wires in at most two transparent conductive layers.

In some embodiments of the present disclosure, referring to FIG. 12, an orthographic projection of the first connection wire 61 on the base substrate at least partially overlaps with an orthographic projection of the second connection wire 62 on the base substrate. In the embodiments of the present disclosure, the third connection wire 63, the fourth connection wire 64 and the fifth connection wire 65 are routed from above and below the first display region, with a long routing distance. By partially overlapping the first connection wire 61 with the second connection wire 62, a capacitance on the first connection wire 61 and the second connection wire 62 may be increased. In this way, capacitances of each connection wire may be substantially the same, a difference between the first light emitting devices in different columns may be reduced, which is advantageous to provide substantially the same driving signal to each first light emitting device.

Figure 19:
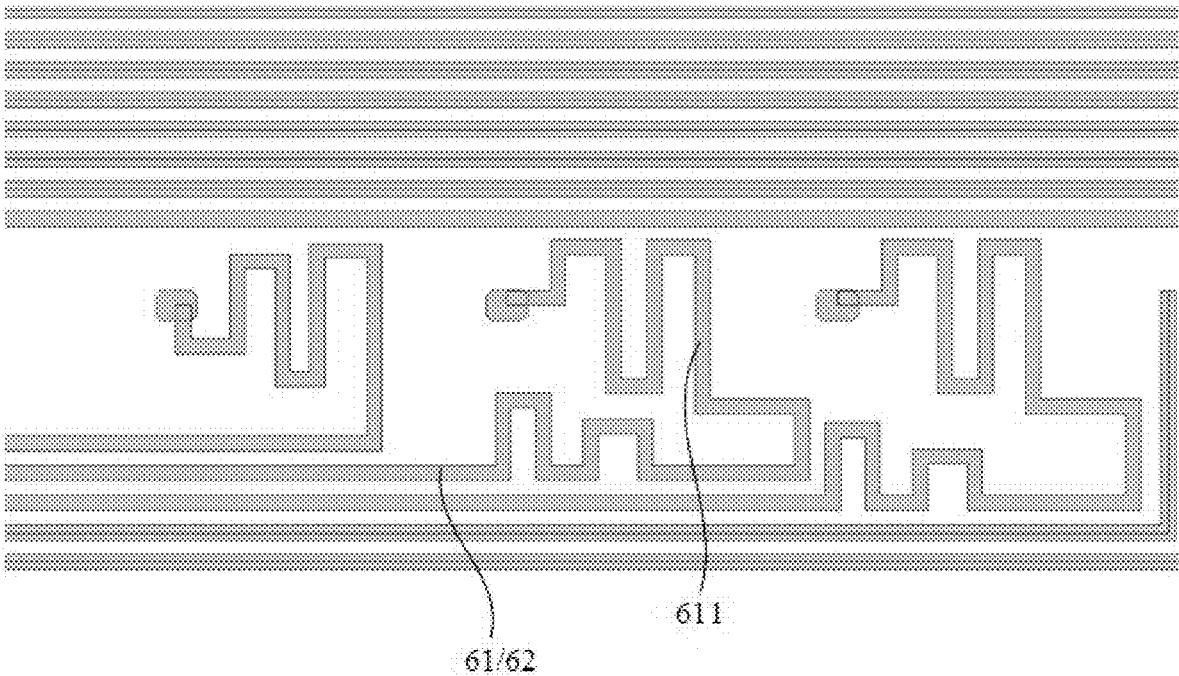
FIG. 19 schematically shows an arched design of a connection wire according to some exemplary embodiments of the present disclosure.

In some embodiments of the present disclosure, with reference to FIG. 19, at least one of the first connection wire 61 and the second connection wire 62 has an arched part 611. In the embodiments of the present disclosure, the third connection wire 63, the fourth connection wire 64 and the fifth connection wire 65 are routed from above and below the first display region, with a long routing distance. With the arch design of the first connection wire 61 and the second connection wire 62, the routing distance of the first connection wire 61 and the second connection wire 62 may be increased, thereby increasing the capacitance thereon. In this way, the capacitances of each connection wire may be substantially the same, the difference between the first light emitting devices in different columns may be reduced, which is advantageous to provide substantially the same driving signal to each first light emitting device.

Figure 21:
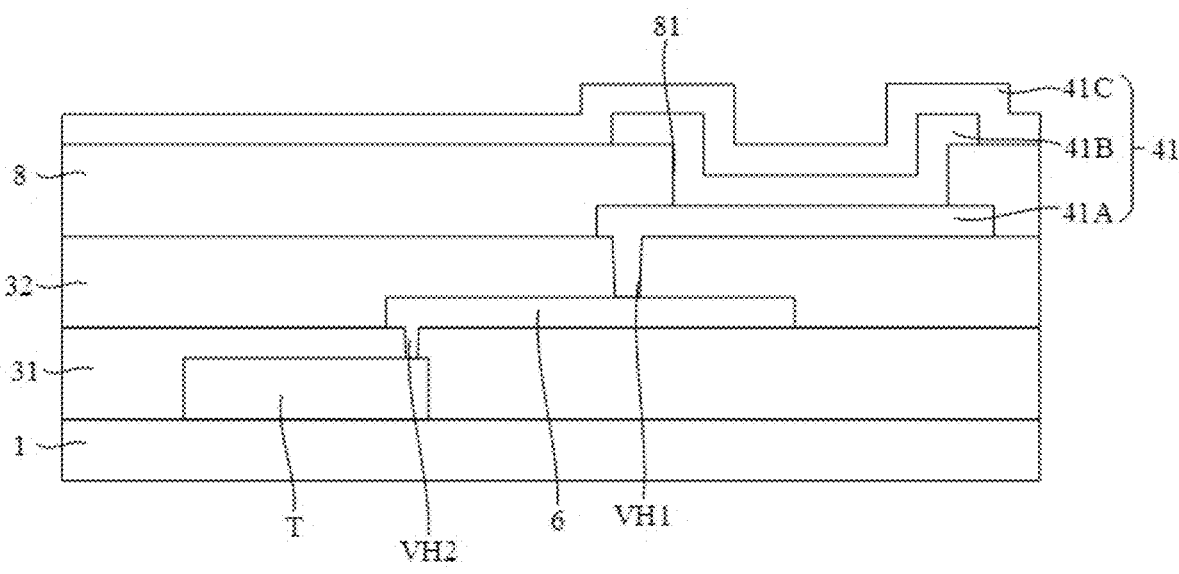
FIG. 21 is a schematic cross-sectional view taken along line BB' in FIG. 18.

FIG. 21 is a schematic cross-sectional view taken along line BB' in FIG. 18. Referring to FIG. 21, the display substrate 10 includes pixel driving circuit structure layers sequentially stacked on the base substrate 1. The pixel driving circuit structure layers may include a thin film transistor T, an insulation layer 31, a connection wire 6, a planarization layer 32 and a first light emitting device 41. The first light emitting device 41 includes an anode structure 41A, a cathode structure 41C and a light emitting structure 41B located between the anode structure 41A and the cathode structure 41C. The anode structure 41A of the first light emitting device 41 is electrically connected to the connection wire 6 through a first connection via hole VH1 penetrating the planarization layer 32. The pixel driving circuit structure layers may include a semiconductor layer, a first insulation layer, a first gate layer, a second insulation layer, a second gate layer, an interlayer insulation layer, a source/drain metal layer, and so on. In some embodiments, the pixel driving circuit may include seven thin film transistors (e.g., a driving transistor, a data writing transistor, a compensation transistor, a reset transistor, a light emission control transistor, etc.), and a storage capacitor. At least one thin film transistor, such as the light emission control transistor, is directly connected to the light emitting device. FIG. 21 merely schematically shows a thin film transistor T (for example, a light emission control transistor). The thin film transistor T includes at least an active layer located in the semiconductor layer, a source contact part, a drain contact part, a gate electrode located in the first gate layer, and a source electrode and a drain electrode located in the source/drain metal layer. The connection wire 6 in FIG. 21 may be, for example, electrically connected to the drain electrode of the light emission control transistor located in the source/drain metal layer.

It should be noted that herein, unless otherwise specified, the "via hole" is used to electrically connect components located in different conductive layers. In the embodiments of the present disclosure, the "via hole" may also take other alternative forms. For example, the via hole may be replaced by a "groove" for electrically connecting components located in different conductive layers.

For example, the anode structure 41A may contain a transparent conductive material such as ITO, etc., and a specific material of the anode structure 41A is not limited in the embodiments of the present disclosure. For example, the cathode structure 41C may be a structure formed on an entire surface of the display substrate 10 (for example, at least completely covering the entire display region), and the cathode structure 41C may contain lithium (Li), aluminum (Al), magnesium (Mg), silver (Ag) and other metal materials. For example, since the cathode structure 41C may be formed as a very thin layer, it has a good light transmittance.

Figure 22:
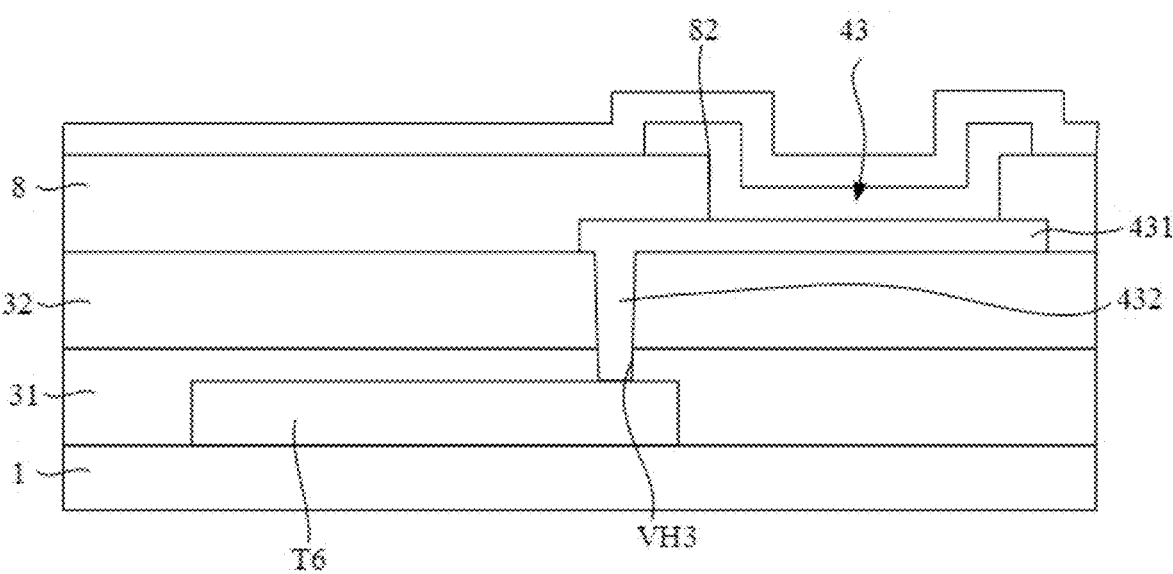
FIG. 22 is a schematic cross-sectional view taken along line CC' in FIG. 18.

FIG. 22 is a schematic cross-sectional view taken along line CC' in FIG. 18. Referring to FIG. 18, FIG. 21 and FIG. 22 in combination, the display substrate 10 may further include a pixel definition layer 8. For example, the pixel definition layer 8 may include a plurality of first openings 81 and a plurality of second openings 82. The plurality of first openings 81 are located in the first display region AA1, and each first opening 81 exposes a portion of the anode structure of the first light emitting device 41. The plurality of second openings 82 are located in the third display region AA3, and each second opening 82 exposes a portion of the anode structure of the third light emitting device 43. The anode structure of the third light emitting device 43 includes an anode body 431 and an anode connection part 432, and at least a portion of the anode connection part 432 has a thickness different from a thickness of the anode body 431. The anode connection part 432 of the third light emitting device 43 is electrically connected to the source electrode or the drain electrode of the thin film transistor below through the third via hole VH3, and at least a portion of the anode connection part 432 has a thickness greater than that of the anode body 431.

Figure 20A:
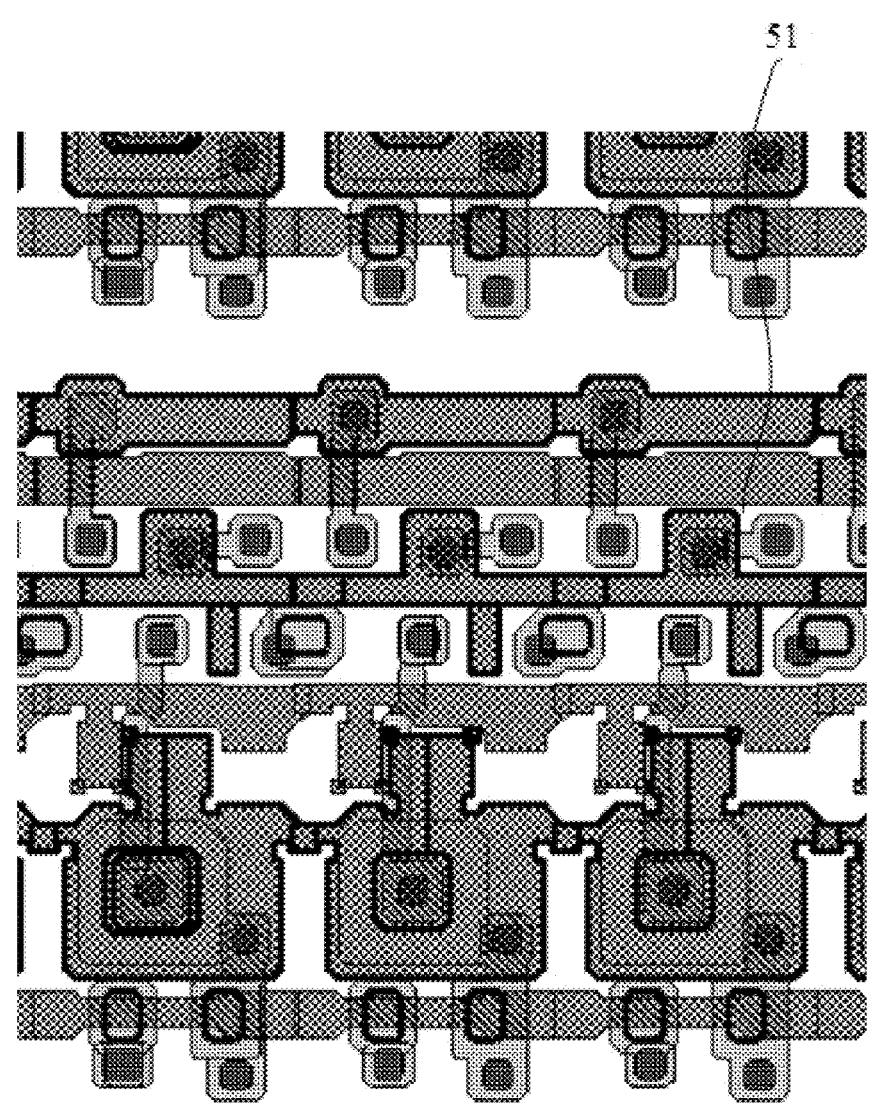
FIG. 20A schematically shows a plan view of a first pixel driving circuit provided in a second display region of a display substrate according to the embodiments of the present disclosure.
Figure 20B:
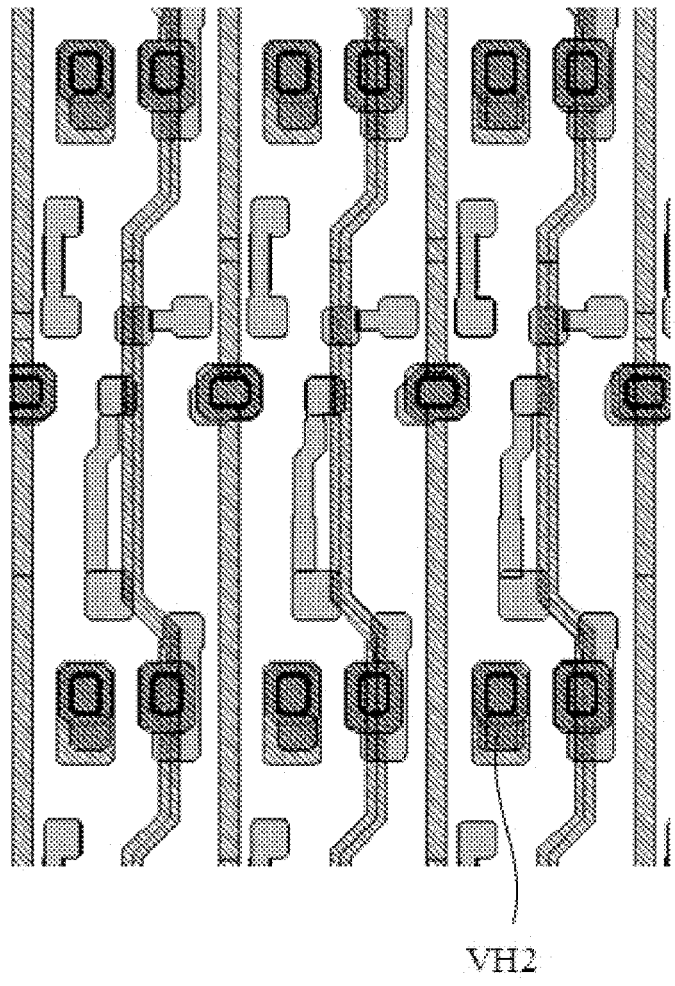
FIG. 20B schematically shows a partial plan view of a source/drain layer and a first planarization layer of the first pixel driving circuit shown in FIG. 20A.
Figure 20C:
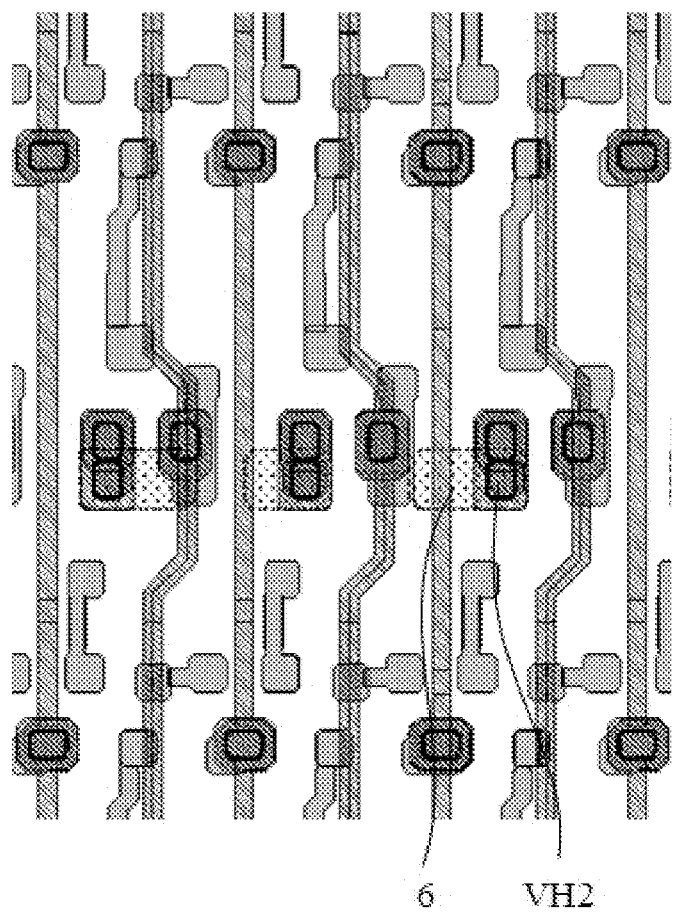
FIG. 20C schematically shows a partial plan view of a source/drain layer, a first planarization layer and a first transparent conductive layer of the first pixel driving circuit shown in FIG. 20A.
Figure 20D:
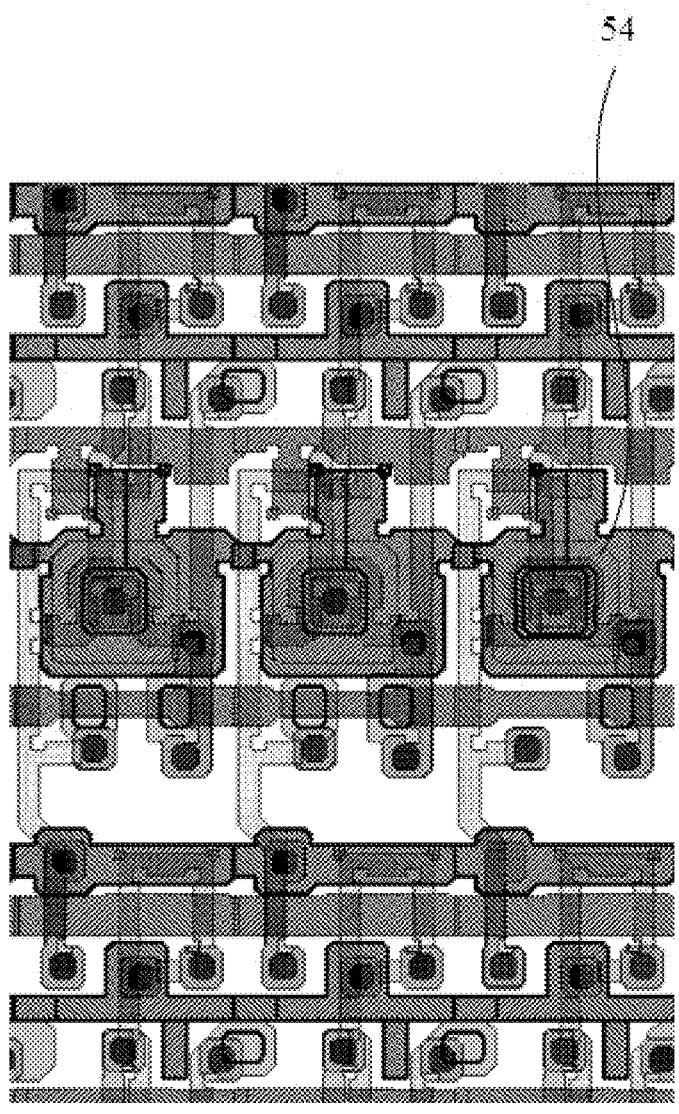
FIG. 20D schematically shows a plan view of a second pixel driving circuit and a dummy circuit provided in a second display region of a display substrate according to the embodiments of the present disclosure.
Figure 20E:
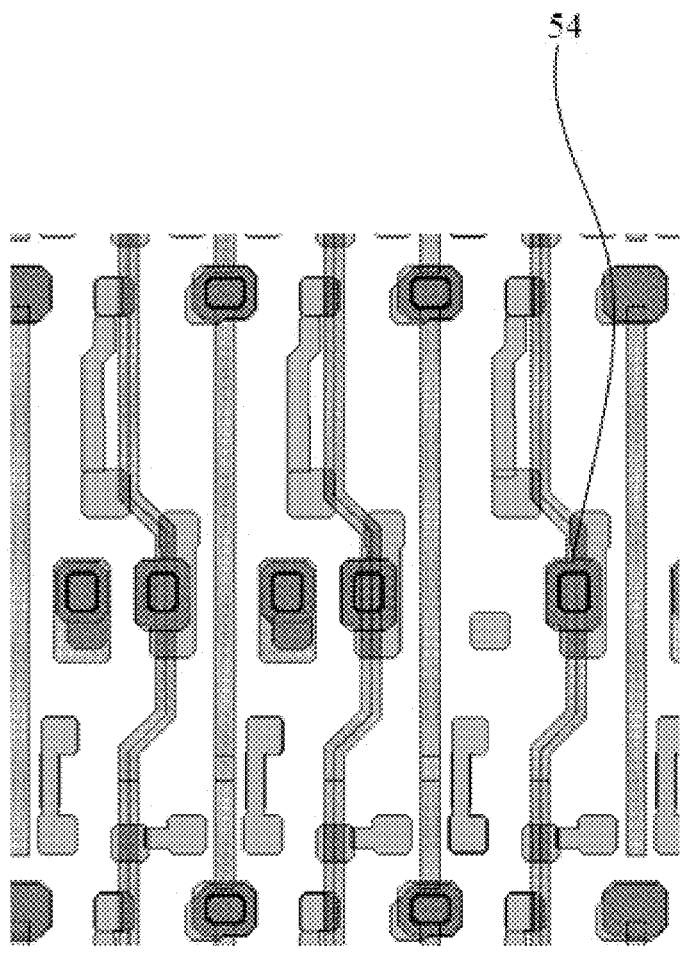
FIG. 20E schematically shows a partial plan view of a source/drain layer and a first planarization layer of the second pixel driving circuit and the dummy circuit shown in FIG. 20D.
Figure 20F:
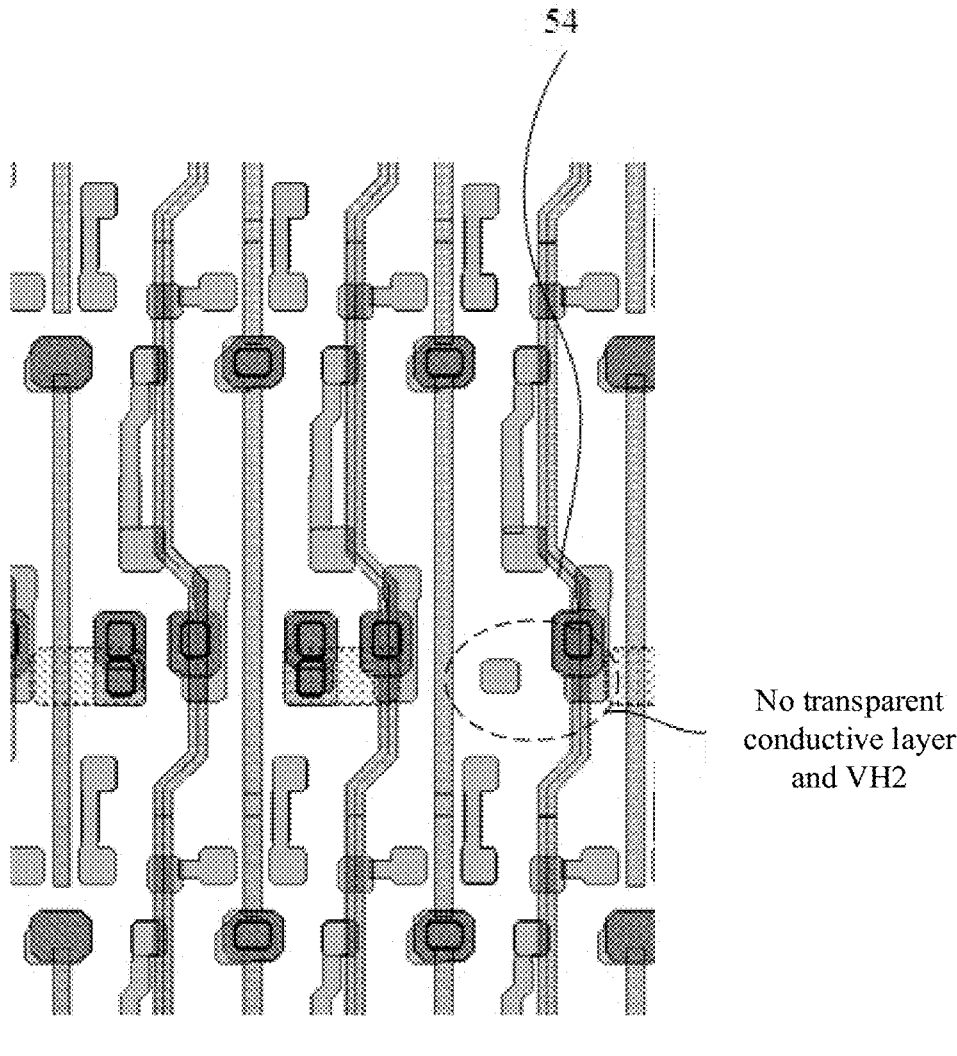
FIG. 20F schematically shows a partial plan view of a source/drain layer, a first planarization layer and a first transparent conductive layer of the second pixel driving circuit and the dummy circuit shown in FIG. 20D.

FIG. 20A schematically shows a plan view of the first pixel driving circuit provided in the second display region of the display substrate according to the embodiments of the present disclosure. FIG. 20B schematically shows a partial plan view of a source/drain layer and a first planarization layer of the first pixel driving circuit shown in FIG. 20A. FIG. 20C schematically shows a partial plan view of a source/drain layer, a first planarization layer and a first transparent conductive layer of the first pixel driving circuit shown in FIG. 20A. FIG. 20D schematically shows a plan view of the second pixel driving circuit and the dummy circuit provided in the second display region of the display substrate according to the embodiments of the present disclosure. FIG. 20E schematically shows a partial plan view of a source/drain layer and a first planarization layer of the second pixel driving circuit and the dummy circuit shown in FIG. 20D. FIG. 20F schematically shows a partial plan view of a source/drain layer, a first planarization layer and a first transparent conductive layer of the second pixel driving circuit and the dummy circuit shown in FIG. 20D.

Referring to FIG. 3, FIG. 4A and FIG. 20A to FIG. 20F, the display substrate further includes a plurality of second pixel driving circuits 52 and a plurality of dummy circuits 54. The plurality of second pixel driving circuits 52 and the plurality of dummy circuits 54 are located in the second display region AA2. In some exemplary embodiments of the present disclosure, two columns of second pixel driving circuits 52 and/or dummy circuits 54 are arranged between at least two adjacent columns of first pixel driving circuits 51.

In the embodiments of the present disclosure, the plurality of connection wires 6 are respectively electrically connected to the plurality of first pixel driving circuits 51 through the second connection via hole VH2.

Referring to FIG. 20F, the second connection via hole VH2 and the connection wire 6 are not formed in a region where the dummy circuits 54 are located. That is, an orthographic projection of the second connection via hole VH2 on the base substrate 1 is spaced from an orthographic projection of the dummy circuits 54 on the base substrate 1.

Referring back to FIG. 3, in some embodiments of the present disclosure, a mirror design may be adopted for the connection wires for providing driving signals to each first light emitting device 41. Specifically, orthographic projections of the connection wires for providing driving signals to a plurality of first light emitting devices located in the first to the $n^{th}$ columns and in the first to the $m^{th}$ rows on the base substrate are axisymmetric with orthographic projections of the connection wires for providing driving signals to a plurality of first light emitting devices located in the $(n+1)^{th}$ to the $2n^{th}$ columns and in the first to the $m^{th}$ rows on the base substrate with respect to the first symmetry axis AX1. Orthographic projections of the connection wires for providing driving signals to a plurality of first light emitting devices located in the first to the $n^{th}$ columns and in the first to the $m^{th}$ rows on the base substrate are axisymmetric with orthographic projections of the connection wires for providing driving signals to a plurality of first light emitting devices located in the first to the $n^{th}$ columns and in the $(m+1)^{th}$ to the $2m^{th}$ rows on the base substrate with respect to the second symmetry axis AX2. In this case, the connection wires for the plurality of first light emitting devices 41 located in one quarter of the circular region are described as an example of the embodiments of the present disclosure, and the connection wires for the plurality of first light emitting devices 41 located in the other three quarters of the circular region may refer to this example.

It should be noted that the embodiments of the present disclosure are not limited to this. In other embodiments, the mirror design may not be adopted for the connection wires for a plurality of first light emitting devices located in the first display region AA1.

For example, the first transparent conductive layer 71 and the transparent conductive layer 72 respectively contain transparent conductive materials. The transparent conductive material may be selected from indium tin oxide (ITO), indium zinc oxide (IZO) and other transparent metal oxides. That is, in the embodiments of the present disclosure, the connection wires 6 (including the first connection wire 61, the second connection wire 62, the third connection wire 63, the fourth connection wire 64 and the fifth connection wire 65) are transparent conductive lines. In this way, the transmissivity of the first display region AA1 and the signal-to-noise ratio of the image output by the sensor may be further improved, and the diffraction caused by the opaque wiring may also be avoided, thereby further improving a quality of the image output by the sensor.

At least some embodiments of the present disclosure further provide a display device. Referring to FIG. 1 and FIG. 2, the display device may include the display substrate and the sensor 2001 (e.g., a camera) as described above.

As described above, the display substrate includes the first display region, the second display region and the third display region. The pixel density of the second display region and the pixel density of the third display region are greater than the pixel density of the first display region. The sensor 2001 is located on a side of the base substrate 1 away from a pixel array, and a photosensitive surface of the sensor 2001 faces the display substrate. The orthographic projection of the sensor 2001 on the base substrate 1 overlaps with the orthographic projection of the first display region AA1 on the base substrate 1, for example, located within the orthographic projection of the first display region AA1 on the base substrate 1. In this way, the light passing the first display region AA1 may be used for imaging, thereby achieving the under display camera function.

The sensor 2001 may have a structure known in the art, for example, including a complementary metal oxide semiconductor (CMOS) image sensor or a charge coupled device (CCD) image sensor. The sensor 2001 may be electrically connected to an image processor. In addition to the image sensor, an imaging module including the image sensor may further include, for example, a lens assembly in order to achieve a better imaging effect. The lens assembly and the image sensor may be arranged sequentially along an optical axis of the lens assembly in a direction perpendicular to the base substrate 1.

The display device may include any apparatus or product with a display function. For example, the display device may be a smart phone, a mobile phone, an e-book reader, a personal computer (PC), a laptop PC, a netbook PC, a personal digital assistant (PDA), a portable multimedia player (PMP), a digital audio player, a mobile medical apparatus, a camera, a wearable apparatus (such as head-mounted apparatus, electronic clothing, electronic bracelet, electronic necklace, electronic accessory, electronic tattoo, or smart watch), a television, etc.

Although some embodiments of the general technical concept of the present disclosure have been illustrated and described, it should be understood by those ordinary skilled in the art that changes may be made to these embodiments without departing from the principle and spirit of the general technical concept of the present disclosure. The scope of the present disclosure is defined by the claims and their equivalents.

What is claimed is:

1. A display substrate, comprising a first display region and a second display region at least partially surrounding the first display region, wherein the display substrate comprises:

a base substrate;

a plurality of first light emitting devices, wherein the plurality of first light emitting devices are arranged in an array in a first direction and a second direction on the base substrate and are located in the first display region;

a plurality of first pixel driving circuits, wherein the plurality of first pixel driving circuits are arranged in an array in the first direction and the second direction on the base substrate and are located in the second display region, and at least a part of the first pixel driving circuits are configured to respectively drive the plurality of first light emitting devices to emit light; and a plurality of connection wires, wherein at least one of the plurality of connection wires has one end electrically connected to at least one of the first light emitting devices and the other end electrically connected to at least one of the first pixel driving circuits, and the plurality of connection wires are configured to respectively transmit driving signals to the plurality of first light emitting devices, wherein the plurality of first light emitting devices are arranged in a plurality of columns in the first direction to form a plurality of pixel column groups, the plurality of pixel column groups comprise a first pixel column group, a second pixel column group and a third pixel column group, and the first pixel column group, the second pixel column group and the third pixel column group are arranged from an edge of the first display region to a center of the first display region;

wherein the connection wires for transmitting driving signals to the first light emitting devices in the first pixel column group are located in a same transparent conductive layer as the connection wires for transmitting driving signals to the first light emitting devices in the third pixel column group;

wherein the second display region comprises a first display sub-region and a second display sub-region, and the first display sub-region and the second display sub-region are located on opposite sides of the first display region in the first direction; and wherein a plurality of first light emitting devices in a first column to an $n^{th}$ column are electrically connected to the first pixel driving circuits located in the first display sub-region through a part of the plurality of connection wires, and a plurality of first light emitting devices in an $(n+1)^{th}$ column to a $2n^{th}$ column are electrically connected to the first pixel driving circuits located in the second display sub-region through the other part of the plurality of connection wires.

2. The display substrate according to claim 1, wherein the plurality of first light emitting devices are arranged in 2n columns in the first direction, n is a positive integer, and a first column of first light emitting devices are located at an edge of the first display region on a side of the first display region close to the second display region;

wherein the plurality of connection wires comprise a first connection wire and a second connection wire;

wherein the first pixel column group comprises the first light emitting devices located in a first column to an $n_1^{th}$ column, the second pixel column group comprises the first light emitting devices in an $(n_1+1)^{th}$ column to an $n_2^{th}$ column, the first light emitting devices in the first column to the $n_1^{th}$ column are electrically connected to corresponding first pixel driving circuits through first connection wires, and the first light emitting devices in the $(n_1+1)^{th}$ column to the $n_2^{th}$ column are electrically connected to corresponding first pixel driving circuits through second connection wires, $1<n_1<n_2<n$, and both $n_1$ and $n_2$ are positive integers; and wherein the first connection wires are located in a first transparent conductive layer, and the second connection wires are located in a second transparent conductive layer.

3. The display substrate according to claim 2, wherein the first connection wire and the second connection wire both extend through the first display region and the second display region in the first direction.

4. The display substrate according to claim 2, wherein the plurality of first light emitting devices are arranged in 2m rows in the second direction, m is a positive integer, and a first row of first light emitting devices are located at an edge of the first display region on a side of the first display region close to the second display region;

wherein the plurality of connection wires further comprise a third connection wire;

wherein the third pixel column group comprises the first light emitting devices located in an $(n_2+1)^{th}$ column to an $n^{th}$ column and in an $(m_1+1)^{th}$ row to an $m^{th}$ row, and the first light emitting devices located in the $(n_2+1)^{th}$ column to the $n^{th}$ column and in the $(m_1+1)^{th}$ row to the $m^{th}$ row are electrically connected to corresponding first pixel driving circuits through third connection wires, $1<m_1<m$, and $m_1$ is a positive integer; and wherein the third connection wire comprises a first part, a second part and a third part, the first part of the third connection wire extends in the first direction and is completely located in the first display region, the second part of the third connection wire extends in the second direction and extends from the first display region to the second display region, and the third part of the third connection wire extends in the second display region in the first direction.

5. The display substrate according to claim 4, wherein the third part of the third connection wire is spaced from the first connection wire in the second direction, and an extension line of the third part of the third connection wire in the first direction does not pass through the first display region.

6. The display substrate according to claim 5, wherein the third connection wire further comprises a fourth part and a fifth part, the fourth part of the third connection wire extends in the second direction, the fifth part of the third connection wire extends in the first direction, and the fourth part and the fifth part of the third connection wire are both located in the second display region.

7. The display substrate according to claim 4, wherein the plurality of connection wires further comprise a fourth connection wire;

wherein the first light emitting devices located in the $(n_2+1)^{th}$ column to the $n^{th}$ column and in a $(m_2+1)^{th}$ row to a $m_1^{th}$ row are electrically connected to corresponding first pixel driving circuits through fourth connection wires, $1 \leq m_2 < m_1 - 1$, and $m_2$ is a positive integer; and wherein a part of the fourth connection wire is located in the first transparent conductive layer, and the other part of the fourth connection wire is located in the second transparent conductive layer.

8. The display substrate according to claim 7, wherein the fourth connection wire comprises a first part, a second part, a third part, a fourth part and a fifth part, the first part of the fourth connection wire extends in the first direction and is completely located in the first display region, the second part of the fourth connection wire extends in the second direction and extends from the first display region to the second display region, the third part of the fourth connection wire extends in the first direction, the fourth part of the fourth connection wire extends in the second direction, the fifth part of the fourth connection wire extends in the first direction, and the third part, the fourth part and the fifth part of the fourth connection wire are all located in the second display region.

9. The display substrate according to claim 8, wherein the first part, the second part, the third part and the fourth part of the fourth connection wire are all located in the first transparent conductive layer, and the fifth part of the fourth connection wire is located in the second transparent conductive layer.

10. The display substrate according to claim 7, wherein the plurality of connection wires further comprise a fifth connection wire;

wherein the first light emitting devices in the $(n_2+1)^{th}$ column to the $n^{th}$ column and in the first row to a $m_2^{th}$ row are electrically connected to the first pixel driving circuits through fifth connection wires; and wherein a part of the fifth connection wire is located in the first transparent conductive layer, and the other part of the fifth connection wire is located in the second transparent conductive layer.

11. The display substrate according to claim 10, wherein the fifth connection wire comprises a first part, a second part, a third part, a fourth part and a fifth part, the first part of the fifth connection wire extends in the first direction and is completely located in the first display region, the second part of the fifth connection wire extends in the second direction and extends from the first display region to the second display region, the third part of the fifth connection wire extends in the first direction, the fourth part of the fifth connection wire extends in the second direction, the fifth part of the fifth connection wire extends in the first direction, and the third part, the fourth part and the fifth part of the fifth connection wire are all located in the second display region; and wherein the first part, the second part, the third part and the fourth part of the fifth connection wire are all located in the first transparent conductive layer, and the fifth part of the fifth connection wire is located in the second transparent conductive layer.

12. The display substrate according to claim 11, wherein for a plurality of fifth connection wires for providing driving signals to the first light emitting devices located in the $(n_2+1)^{th}$ column to the $n^{th}$ column and in the first row to the $m_2{}^{th}$ row, first parts and second parts of a part of the fifth connection wires are located in the first transparent conductive layer, and first parts and second parts of the other part of the fifth connection wires are located in the second transparent conductive layer; and wherein for the plurality of fifth connection wires for providing driving signals to the first light emitting devices located in the $(n2+1)^{th}$ column to the $n^{th}$ column and in the first row to the $m_2{}^{th}$ row, third parts and fourth parts of all the fifth connection wires are located in the first transparent conductive layer, and fifth parts of all the fifth connection wires are located in the second transparent conductive layer.

13. The display substrate according to claim 2, wherein an orthographic projection of the first connection wire on the base substrate at least partially overlaps with an orthographic projection of the second connection wire on the base substrate.

14. The display substrate according to claim 2, wherein the first transparent conductive layer and the second transparent conductive layer respectively comprise transparent conductive materials.

15. The display substrate according to claim 1, wherein the plurality of first pixel driving circuits in the first display sub-region are arranged in k columns in the first direction, and a first column of first pixel driving circuits are located at an edge of the first display sub-region on a side of the first display sub-region close to the first display region, and k is a positive integer greater than or equal to n; and wherein at least a part column of the first column of first pixel driving circuits to a $k^{th}$ column of first pixel driving circuits are electrically connected to the first column of first light emitting devices to the $n^{th}$ column of first light emitting devices through the connection wires.

16. The display substrate according to claim 1, wherein the display substrate further comprises a plurality of second pixel driving circuits and a plurality of dummy circuits, and the plurality of second pixel driving circuits and the plurality of dummy circuits are all located in the second display region;

wherein two columns of the second pixel driving circuits and/or dummy circuits are arranged between at least two adjacent columns of the first pixel driving circuits;

wherein the plurality of connection wires are respectively electrically connected to the plurality of first pixel driving circuits through a second connection via hole; and wherein an orthographic projection of the second connection via hole on the base substrate is spaced from an orthographic projection of the dummy circuit on the base substrate.

17. The display substrate according to claim 1, wherein an orthographic projection of the connection wires for providing driving signals to the plurality of first light emitting devices located in the first column to the $n^{th}$ column and in the first row to the $m^{th}$ row on the base substrate is axisymmetric with an orthographic projection of the connection wires for providing driving signals to the plurality of first light emitting devices located in the $(n+1)^{th}$ column to the $2n^{th}$ column and in the first row to the $m^{th}$ row on the base substrate, with respect to a first symmetry axis extending in the second direction; and/or an orthographic projection of the connection wires for providing driving signals to the plurality of first light emitting devices located in the first column to the $n^{th}$ column and in the first row to the $m^{th}$ row on the base substrate is axisymmetric with an orthographic projection of the connection wires for providing driving signals to the plurality of first light emitting devices located in the first column to the $n^{th}$ column and in the $(m+1)^{th}$ row to the $2m^{th}$ row on the base substrate with respect to a second symmetry axis extending in the first direction.

18. A display device, comprising the display substrate according to claim 1.

19. The display device according to claim 18, further comprising a sensor, wherein, the display substrate has a first side for display and a second side opposite to the first side, and the first display region allows a light from the first side to at least partially transmit to the second side, the sensor is arranged on the second side of the display substrate, and the sensor is configured to receive the light from the first side; and wherein an orthographic projection of the sensor on the display substrate at least partially overlaps with the first display region.

* * * * *